United States Patent
Then et al.

(10) Patent No.: US 11,450,617 B2
(45) Date of Patent: Sep. 20, 2022

(54) TRANSMISSION LINE STRUCTURES FOR III-N DEVICES

(71) Applicant: Intel Corporation, Santa Clara, CA (US)

(72) Inventors: Han Wui Then, Portland, OR (US); Marko Radosavljevic, Portland, OR (US); Sansaptak Dasgupta, Hillsboro, OR (US); Nidhi Nidhi, Hillsboro, OR (US); Paul B. Fischer, Portland, OR (US); Rahul Ramaswamy, Portland, OR (US); Walid M. Hafez, Portland, OR (US); Johann Christian Rode, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 674 days.

(21) Appl. No.: 16/354,241

(22) Filed: Mar. 15, 2019

(65) Prior Publication Data

US 2020/0294932 A1    Sep. 17, 2020

(51) Int. Cl.
| | |
|---|---|
| *H01L 23/552* | (2006.01) |
| *H01L 29/778* | (2006.01) |
| *H01L 29/66* | (2006.01) |
| *H01L 29/207* | (2006.01) |
| *H01L 23/66* | (2006.01) |
| *H01L 29/20* | (2006.01) |

(52) U.S. Cl.
CPC ............ *H01L 23/552* (2013.01); *H01L 23/66* (2013.01); *H01L 29/207* (2013.01); *H01L 29/66462* (2013.01); *H01L 29/7787* (2013.01); *H01L 29/2003* (2013.01)

(58) Field of Classification Search
CPC ................... H01L 23/552; H01L 23/66; H01L 2223/6627; H01L 2223/6683
See application file for complete search history.

(56) References Cited

U.S. PATENT DOCUMENTS

2019/0006572 A1 * 1/2019 Falcon ................. H05K 1/0216

* cited by examiner

*Primary Examiner* — Daniel P Shook
(74) *Attorney, Agent, or Firm* — Akona IP

(57) ABSTRACT

IC structures that include transmission line structures to be integrated with III-N devices are disclosed. An example transmission line structure includes a transmission line of an electrically conductive material provided above a stack of a III-N semiconductor material and a polarization material. The transmission line structure further includes means for reducing electromagnetic coupling between the line and charge carriers present below the interface of the polarization material and the III-N semiconductor material. In some embodiments, said means include a shield material of a metal or a doped semiconductor provided over portions of the polarization material that are under the transmission line. In other embodiments, said means include dopant atoms implanted into the portions of the polarization material that are under the transmission line, and into at least an upper portion of the III-N semiconductor material under such portions of the polarization material.

20 Claims, 13 Drawing Sheets

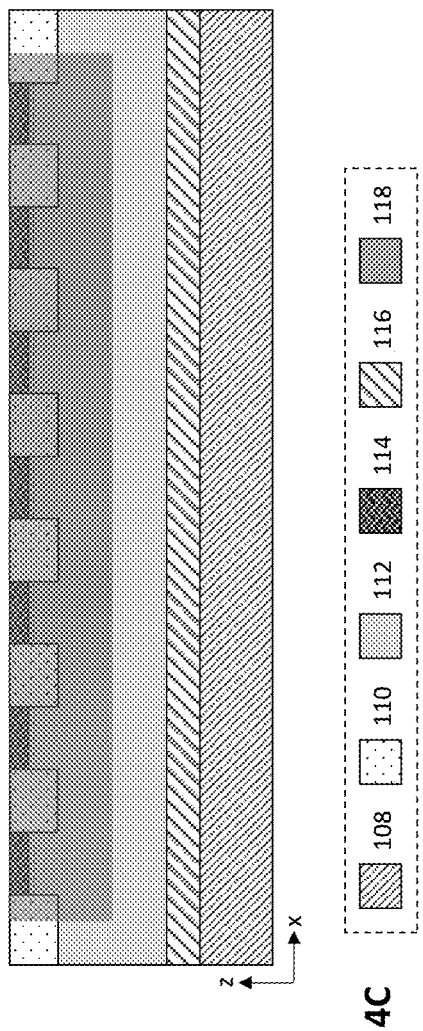

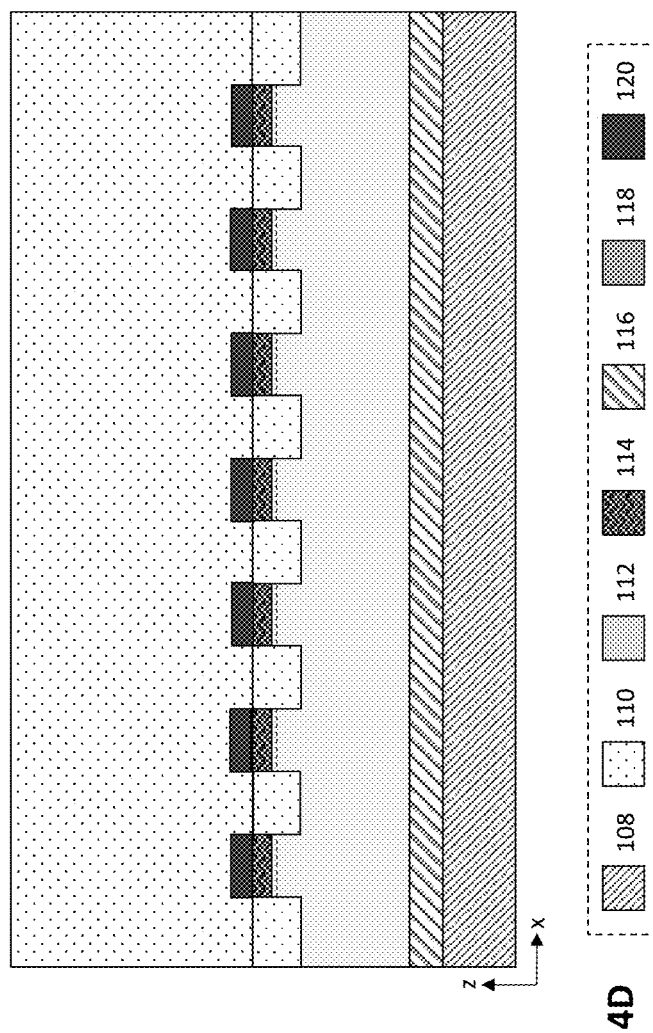

TRANSMISSION LINE STRUCTURES FOR III-N DEVICES

BACKGROUND

Solid-state devices that can be used in high frequency and/or high voltage applications are of great importance in modern semiconductor technologies. For example, radio frequency (RF) integrated circuits (RFIC) and power management integrated circuits (PMIC) may be critical functional blocks in system on a chip (SoC) implementations. Such SoC implementations may be found in mobile computing platforms such as smartphones, tablets, laptops, netbooks, and the like. In such implementations, the RFIC and PMIC are important factors for power efficiency and form factor, and can be equally or even more important than logic and memory circuits.

Due, in part, to their large band gap and high mobility, III-N material based transistors, such as gallium nitride (GaN) based transistors, may be particularly advantageous for high frequency and high voltage applications.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIGS. 4A-4E are various views illustrating different example stages in the manufacture of the IC structure using the method of FIG. 3, according to some embodiments of the present disclosure.

DETAILED DESCRIPTION

Overview

Figure 1:
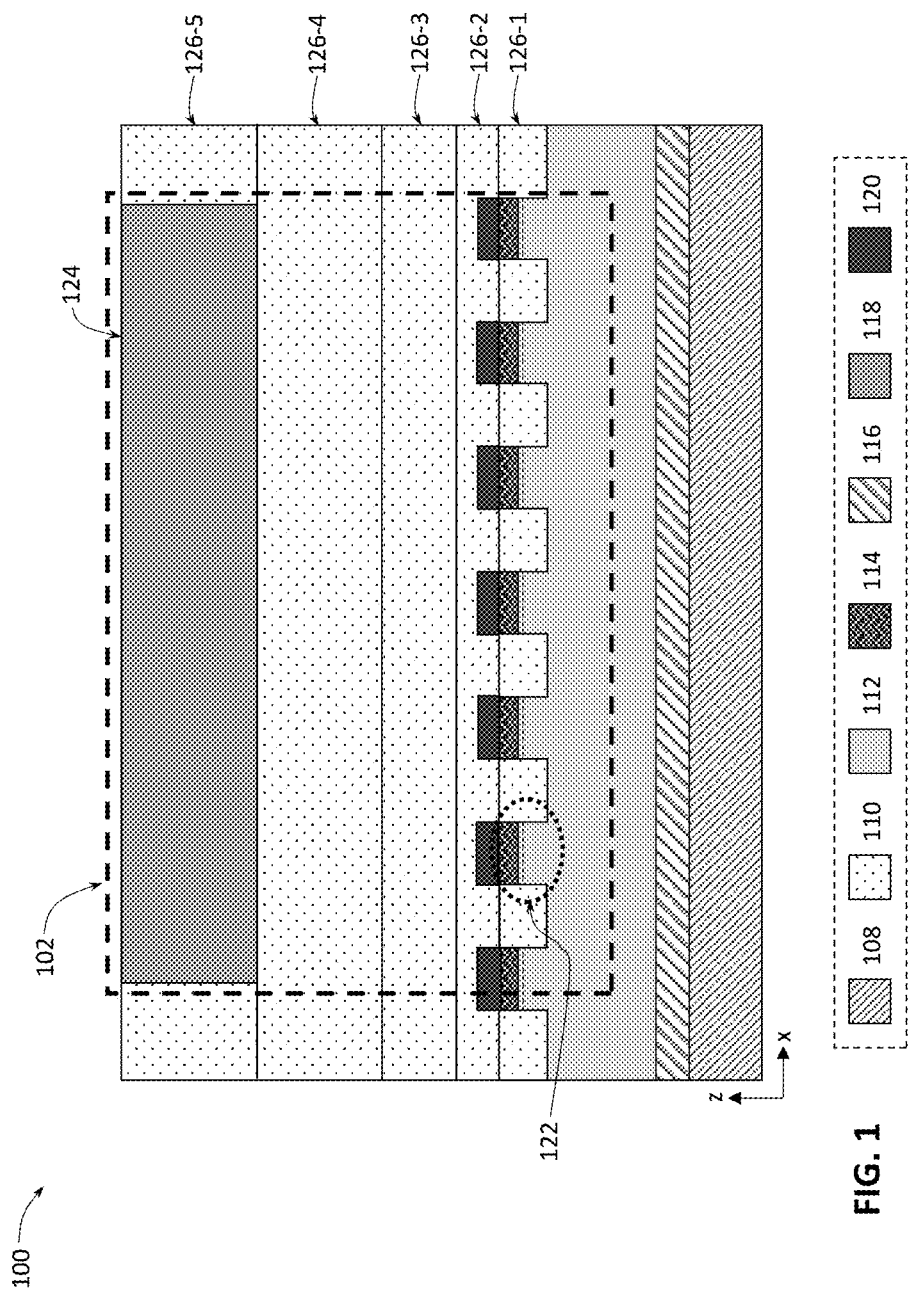
FIG. 1 provides a cross-sectional side view illustrating an integrated circuit (IC) structure that includes a transmission line structure with a shield material above a polarization material, according to some embodiments of the present disclosure.

As mentioned above, transistors based on III-N semiconductor materials (i.e., III-N transistors) have properties that make them particularly advantageous for certain applications. For example, because GaN has a larger band gap (about 3.4 electronvolts (eV)) than silicon (Si; band gap of about 1.1 eV), a GaN transistor is expected to withstand a larger electric field (resulting, e.g., from applying a large voltage to the drain, Vdd) before suffering breakdown, compared to a Si transistor of similar dimensions.

Furthermore, III-N transistors may advantageously employ a 2D electron gas (2DEG) (i.e., a group of electrons, an electron gas, free to move in two dimensions but tightly confined in the third dimension, e.g., a 2D sheet charge) as its transport channel, enabling high mobilities without relying on using impurity dopant atoms. For example, the 2DEG may be formed just below a heterojunction interface formed by deposition (e.g., epitaxial deposition), on a given III-N semiconductor material, of a charge-inducing film of a material having larger spontaneous and piezoelectric polarization, compared to the III-N semiconductor material. Such a film is generally referred to as a "polarization material" while the III-N semiconductor material may be referred to as a "III-N channel material" because this is where a conductive channel (2DEG) is formed during operation of the III-N transistor. Providing a polarization material such as AlGaN over a III-N channel material such as GaN induces tensile strain in the polarization material (due to the lattice mismatch between these two materials; namely, due to the lattice constant of AlGaN being smaller than that of GaN), which allows forming very high charge densities in the underlying III-N channel material without intentionally adding impurity dopant atoms. As a result, high mobilities of charge carriers in the III-N channel material may, advantageously, be realized.

As used herein, the term "III-N semiconductor material" (or, simply, "III-N material" or "III-N channel material") refers to a compound semiconductor material with a first sub-lattice of at least one element from group III of the periodic table (e.g., Al, Ga, In) and a second sub-lattice of nitrogen (N). As used herein, the term "III-N transistor" refers to a field-effect transistor (FET) that includes a III-N material (which may include one or more different III-N materials, e.g., a plurality of different III-N materials stacked over one another) as an active material (e.g., the material in which a conducting channel of the transistor forms during operation, in which context the III-N material may be referred to as a "III-N channel material").

While discussions provided herein refer to the two-dimensional charge carrier layers as "2DEG" layers, embodiments described herein are also applicable to systems and material combinations in which 2D hole gas (2DHG) may be formed, instead of 2DEG. Thus, unless stated otherwise, explanations of embodiments referring to 2DEG may be applied to devices in which 2DHG may be formed instead, all of such embodiments being within the scope of the present disclosure.

Despite the advantages, there are some challenges associated with III-N transistors that may hinder their large-scale implementation. One such challenge relates to integration of RF transmission line structures with III-N materials, which may be explained with reference to, e.g., an RF switch. An RF switch includes a transistor and a transmission line (e.g., an interconnect) of an electrically conductive material, provided over a substrate. Implementing the transistor of an RF switch as a III-N transistor advantageously allows the transistor to handle relatively high voltages and currents. The linearity of an RF switch is measured by the magnitude of harmonics that are generated when an RF signal of frequency f is passed through the transistor and the transmission line, where harmonics refer to signals of frequencies 2f, 3f, etc. The larger the magnitude of the harmonics, the worse is the linearity of the switch. Linearity of RF switches can be adversely affected by the substrate, or materials provided thereon, below the transmission line. Any stray charges, e.g., electrons and holes, can induce parasitic nonlinear capacitive coupling to the transmission line, causing generation of harmonics and, hence, significant distortion to the RF signal. This problem may become especially pronounced for substrates on which III-N transistors are implemented because, as a result of implementing one or more III-N transistors on some portions of a substrate, other portions may also include a stack of a III-N channel material and a polarization material thereon. Even though such a stack may not be needed in portions of the substrate other than where the channel regions of III-N transistors are to be provided, it may be simpler, e.g., in terms of manufacturing processes, to just leave the unused stack there and proceed with fabrication of interconnect structures above. However, even for such unused portions of the stack, a heterojunction interface created by depositing a polarization material over a III-N channel material results in formation of the 2DEG right below the interface (i.e., in the upper portion of the III-N channel material that is below the polarization material). If, then, a transmission line is provided above such an unused portion of a stack of a polarization material over a III-N channel material, nonlinear capacitive coupling may arise between the RF signal propagating through the transmission line and the 2DEG under the polarization material. Namely, portions of the stack of a polarization material over a III-N channel material under the transmission line may act as capacitance cells that change their capacitance depending on the strength of the RF signal propagating through the transmission line. As a result, the RF signal may be subject to different parasitic capacitances, depending on the signal strength, which may contribute to significant nonlinear effects.

Disclosed herein are IC structures, packages, and device assemblies that include III-N devices, e.g., III-N transistors, integrated on the same substrate with transmission line structures. An example transmission line structure includes a transmission line of an electrically conductive material provided above a residue (i.e., unused for III-N devices) stack of a III-N semiconductor material and a polarization material, with an insulator material separating the transmission line from the polarization material underneath. The transmission line structure further includes means for reducing electromagnetic coupling between the transmission line and charge carriers present below the interface of the polarization material and the III-N semiconductor material. In some embodiments, said means may include a shield material of a metal or a doped semiconductor provided over portions of the polarization material that are under the transmission line. In other embodiments, said means may include dopant atoms implanted into the portions of the polarization material that are under the transmission line, and into at least an upper portion of the III-N semiconductor material under such portions of the polarization material. Providing a shield material or implanted dopant atoms may reduce or eliminate nonlinear coupling between the transmission line and any residue charge carriers below the transmission line, which may help preserve integrity of RF signals transmitted through the transmission line, improve error rates, and reduce overall power consumption.

Each of the structures, packages, methods, devices, and systems of the present disclosure may have several innovative aspects, no single one of which being solely responsible for the all of the desirable attributes disclosed herein. Details of one or more implementations of the subject matter described in this specification are set forth in the description below and the accompanying drawings.

In the following detailed description, various aspects of the illustrative implementations may be described using terms commonly employed by those skilled in the art to convey the substance of their work to others skilled in the art. For example, the term "connected" means a direct electrical or magnetic connection between the things that are connected, without any intermediary devices, while the term "coupled" means either a direct electrical or magnetic connection between the things that are connected, or an indirect connection through one or more passive or active intermediary devices. The term "circuit" means one or more passive and/or active components that are arranged to cooperate with one another to provide a desired function. If used, the terms "oxide," "carbide," "nitride," etc. refer to compounds containing, respectively, oxygen, carbon, nitrogen, etc. Similarly, the terms naming various compounds refer to materials having any combination of the individual elements within a compound (e.g., "gallium nitride" or "GaN" refers to a material that includes gallium and nitrogen, "aluminum indium gallium nitride" or "AlInGaN" refers to a material that includes aluminum, indium, gallium and nitrogen, and so on). Further, the term "high-k dielectric" refers to a material having a higher dielectric constant (k) than silicon oxide, while the term "low-k dielectric" refers to a material having a lower k than silicon oxide. The terms "substantially," "close," "approximately," "near," and "about," generally refer to being within +/−20%, preferably within +/−10%, of a target value based on the context of a particular value as described herein or as known in the art. Similarly, terms indicating orientation of various elements, e.g., "coplanar," "perpendicular," "orthogonal," "parallel," or any other angle between the elements, generally refer to being within +/−5-20% of a target value based on the context of a particular value as described herein or as known in the art.

The terms such as "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with one or both of the two layers or may have one or more intervening layers. In contrast, a first layer described to be "on" a second layer refers to a layer that is in direct contact with that second layer. Similarly, unless explicitly stated otherwise, one feature disposed between two features may be in direct contact with the adjacent features or may have one or more intervening layers.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A), (B), and/or (C).

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

In the following detailed description, reference is made to the accompanying drawings that form a part hereof, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense. For convenience, if a collection of drawings designated with different letters are present, e.g., FIGS. 5A-5B, such a collection may be referred to herein without the letters, e.g., as "FIG. 5." In the drawings, same reference numerals refer to the same or analogous elements/materials shown so that, unless stated otherwise, explanations of an element/material with a given reference numeral provided in context of one of the drawings are applicable to other drawings where element/materials with the same reference numerals may be illustrated.

In the drawings, some schematic illustrations of example structures of various structures, devices, and assemblies described herein may be shown with precise right angles and straight lines, but it is to be understood that such schematic illustrations may not reflect real-life process limitations that may cause the features to not look so "ideal" when any of the structures described herein are examined using, e.g., TEM or scanning electron microscopy (SEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region(s), and/or occasional dislocation defects of single atoms or clusters of atoms. There may be other defects not listed here but that are common within the field of device fabrication.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

Various IC structures that include at least one transmission line structure as described herein, integrated with one or more III-N devices, may be implemented in one or more components associated with an IC or/and between various such components. In various embodiments, components associated with an IC include, for example, transistors, diodes, power sources, resistors, capacitors, inductors, sensors, transceivers, transmitters, receivers, antennas, etc. Components associated with an IC may include those that are mounted on an IC, provided as an integral part of an IC, or those connected to an IC. The IC may be either analog or digital, or may include a combination of analog and digital circuitry, and may be used in a number of applications, such as microprocessors, optoelectronics, logic blocks, audio amplifiers, etc., depending on the components associated with the IC. In some embodiments, IC structures as described herein may be included in a RFIC, which may, e.g., be included in any component associated with an IC of an RF receiver, an RF transmitter, or an RF transceiver, or any other RF device, e.g., as used in telecommunications within base stations (BS) or user equipment (UE) devices. Such components may include, but are not limited to, RF switches (e.g., switches between different antenna elements of an RF antenna array), RF filters (including arrays of RF filters, or RF filter banks), power amplifiers (PA), or other portions of RF devices. In some embodiments, the IC structures as described herein may be employed as part of a chipset for executing one or more related functions in a computer.

Transmission Line Structures with a Shield Material above the Polarization Layer As described above, in III-N devices, piezoelectric polarization due to strained films of polarization materials (e.g., AlGaN) on top of III-N channel materials (e.g., GaN) may be used to generate 2DEG. For example, tensile strain in a polarization material can lead to formation of 2DEG in the underlying III-N channel material, e.g., within the upper 1-3 nanometers of the underlying III-N channel material. While having the 2DEG in the upper portion of the III-N channel material under the polarization material can be very useful when used in a channel region of a III-N transistor (e.g., underneath the gate stack of the transistor), the 2DEG formed in the III-N channel material below any residue portions of the polarization material that may be left remaining underneath a transmission line may cause problems for RF signals transmitted through the line due to nonlinear coupling between the transmission line and the 2DEG underneath.

A first embodiment of the present disclosure, illustrated in FIG. 1, is based on recognition that providing a shield material of a metal or a doped semiconductor over one or more portions of the polarization material present below the transmission line may reduce or eliminate nonlinear coupling between the transmission line and the 2DEG underneath, which may advantageously improve linearity of the transmission line. In particular, providing such a shield material may replace the nonlinear coupling between the transmission line and the 2DEG underneath the line with a linear coupling between the transmission line and the shield material, where the linear coupling may be accounted for during the design of the transmission line structure.

FIG. 1 provides a cross-sectional side view illustrating an IC structure 100 that includes a transmission line structure 102 (an approximate boundary of which is illustrated in FIG. 1 with a thick dashed line) with a shield material above a polarization material, according to some embodiments of the present disclosure. A legend provided within a dashed box at the bottom of FIG. 1 illustrates colors/patterns used to indicate some classes of materials of some of the elements shown in this figure, so that the figure is not cluttered by too many reference numerals. For example, FIG. 1 uses different colors/patterns to identify a support structure 108, an insulator 110, a III-N channel material 112, a polarization material 114, a buffer material 116, an electrically conductive material 118, and a shield material 120.

The support structure 108 may be any suitable structure, e.g., a substrate, a die, or a chip, on which III-N devices, e.g., III-N transistors, as well as transmission line structures as described herein, may be implemented. In some embodiments, the support structure 108 may include a semiconductor material such as silicon. In other implementations, the support structure 108 may include/be alternate materials, which may or may not be combined with silicon, that include but are not limited to sapphire, silicon carbide, germanium, indium antimonide, lead telluride, indium arsenide, indium phosphide, gallium arsenide, indium gallium arsenide, gallium antimonide, or other combinations of materials. In some embodiments, the support structure 108 may include a ceramic material, or any other non-semiconductor material. For example, in some embodiments, the support structure 108 may include glass, a combination of organic and inorganic materials, embedded portions having different materials, etc. Although a few examples of materials from which the support structure 108 may be formed are described here, any material that may serve as a foundation upon which at least one III-N transistor and at least one transmission line structure as described herein may be built falls within the spirit and scope of the present disclosure.

In various embodiments, the insulator 110 may be provided in various portions of the IC structure 100, e.g., encompassing at least portions 122 of a stack of the III-N channel material 112 and the polarization material 114, between different portions 122, and between the portions 122 and the electrically conductive material 118 of a transmission line 124, as shown in FIG. 1. In various embodiments, an insulating material in the IC structure 100 may include different insulating materials in different portions of the IC structure 100, e.g., one type of the insulator 110 encompassing at least portions 122 of a stack of the III-N channel material 112 and the polarization material 114, another type of the insulator 110 between the portions 122 and the transmission line 124, etc.

In order to not clutter the drawing, FIG. 1 illustrates a label with a reference numeral 122 for only one portion 122 of a stack of the III-N channel material 112 and the polarization material 114, even though seven such portions are illustrated. It should be noted that the portions 122 illustrated in FIG. 1 provide mere an example of how a stack of the III-N channel material 112 and the polarization material 114 may be provided below a transmission line, e.g., the transmission line 124. In various embodiments, any other number of the portions 122, in any other suitable geometry and placement with respect to one another, may be present below the transmission line 124. For example, the portions 122 do not have to be periodic as shown in FIG. 1. In other examples, only one portion 122 may be present underneath at least a portion of the transmission line 124, or the portion 122 may extend underneath substantially all of the transmission line 124.

FIG. 1 also illustrates several horizontal lines in the insulator 110, intended to illustrate different example layers 126 in which various devices (e.g., various interconnects, transistors, etc.) may be provided. For example, III-N transistors may be provided in a first layer 126-1, which may be referred to as a "frontend" layer. Although FIG. 1 does not specifically illustrate any III-N transistors, such transistors may advantageously make use of a stack of the III-N channel material 112 and the polarization material 114 provided over the support structure 108, where residual portions of the stack that are not used for implementation of III-N transistors may be the one or more portions 122 shown in FIG. 1. Thus, the one or more portions 122 may be in the first layer 126-1 of the insulator 110. FIG. 1 also illustrates four additional layers of the insulator 110, shown as layers 126-2 through 126-5, which may be referred to as "backend" or "metallization" layers because this is where various backend or metallization structures may be provided, with the transmission line 124 being one example of such a backend or metallization structure. Again, the number and the division between the different layers 126 of the insulator 110 shown in FIG. 1 is merely one example, and, in various embodiments, the insulator 110 may be provided between the transmission line 124 and the one or more portions 124 in any one or more layers.

Examples of the insulator 110 may include silicon oxide, silicon nitride, aluminum oxide, silicon oxynitride, or any other suitable interlayer dielectric (ILD) materials used in semiconductor manufacturing. Although not specifically shown in FIG. 1, in some embodiments, an insulating layer, e.g., a layer of the insulator 110, may be provided between the support structure 108 and the buffer material 116 or, if the buffer material 116 is not present, the III-N channel material 112. Such an insulating layer may, e.g., include an oxide isolation layer, and may be used to electrically isolate the semiconductor material of the support structure 108 from other regions of or surrounding the III-N transistor and/or from other regions of or surrounding other III-N devices (not specifically shown in FIG. 1). Providing such an insulating layer over the support structure 108 and below the III-N channel material 112 may help mitigate the likelihood that undesirable conductive pathways will form through the support structure 108 (e.g., a conductive pathway between source and drain regions of a III-N transistor).

Turning to the materials of the portions 122 of a stack of the III-N channel material 112 and the polarization material 114, in some embodiments, the III-N channel material 112 may be formed of a compound semiconductor with a first sub-lattice of at least one element from group III of the periodic table (e.g., Al, Ga, In), and a second sub-lattice of nitrogen (N). In some embodiments, the III-N channel material 112 may be a binary, ternary, or quaternary III-N compound semiconductor that is an alloy of two, three, or even four elements from group III of the periodic table (e.g., boron, aluminum, indium, gallium) and nitrogen. In general, the III-N channel material 112 may be composed of various III-N semiconductor material systems including, for example, N-type or P-type III-N materials systems, depending on whether the III-N transistor to be formed with a portion of the III-N channel material 112 in its' channel region is an N-type or a P-type transistor. As used herein, the term "channel region" refers to a portion of the III-N channel material 112 where a transistor channel of a III-N transistor forms during operation of the III-N transistor. For some N-type transistor embodiments, the III-N channel material 112 may advantageously be a III-N material having a high electron mobility, such as, but not limited to, GaN. In some embodiments, the III-N channel material 112 may be a ternary III-N alloy, such as InGaN, or a quaternary III-N alloy, such as AlInGaN, in any suitable stoichiometry.

In some embodiments, the III-N channel material 112 may be formed of a highly crystalline semiconductor, e.g., of substantially a monocrystalline semiconductor (possibly with some limited amount of defects, e.g., dislocations).

In some embodiments, the III-N channel material 112 may be an intrinsic III-N semiconductor material or alloy, not intentionally doped with any electrically active impurity. In alternate embodiments, one or more a nominal impurity dopant atom level may be present within the III-N channel material 112, for example to set a threshold voltage Vt of the III-N transistor(s), or to provide halo pocket implants, etc. In such impurity-doped embodiments however, impurity dopant atom level within the III-N channel material 112 may be relatively low, for example below $10^{15}$ dopant atoms per cubic centimeter ($cm^{-3}$), or below $10^{13}$ $cm^{-3}$.

In various embodiments, a thickness of the III-N channel material 112 may be between about 5 and 2000 nanometers, including all values and ranges therein, e.g., between about 50 and 1000 nanometers, or between about 10 and 50 nanometers. Unless specified otherwise, all thicknesses described herein refer to a dimension measured in a direction perpendicular to the support structure 108 (i.e., measured along the z-axis of the example coordinate system shown in FIGS. 1 and 2).

Turning now to the polarization material 114, in general, the polarization material 114 may be a layer of a charge-inducing film of a material having larger spontaneous and/or piezoelectric polarization than that of the bulk of the III-N layer material immediately below it (e.g., the III-N channel material 112), creating a heterojunction (i.e., an interface that occurs between two layers or regions of semiconductors having unequal band gaps) with the III-N channel material 112, and leading to formation of 2DEG at or near (e.g., immediately below) that interface. As described above, a 2DEG layer may be formed in a layer of a III-N channel material immediately below a suitable polarization layer, which is illustrated in FIG. 1 with a dashed line in the upper portion of the III-N channel material 112 below the polarization material 114 of the portions 122. In various embodiments, the polarization material 114 may include materials such as AlN, InAlN, AlGaN, or $Al_xIn_yGa_{1-x-y}N$, and may have a thickness between about 1 and 100 nanometers, including all values and ranges therein, e.g., between about 5 and 15 nanometers or between about 10 and 30 nanometers.

In some embodiments of FIG. 1, the IC structure 100 may, optionally, include a buffer material 116 between the III-N channel material 112 and the support structure 108. In some embodiments, the buffer material 116 may be a layer of a semiconductor material that has a band gap larger than that of the III-N channel material 112, so that the buffer material 116 can serve to prevent current leakage from the III-N transistor(s) to the support structure 108. Furthermore, a properly selected semiconductor for the buffer material 116 may enable better epitaxy of the III-N channel material 112 thereon, e.g., it may improve epitaxial growth of the III-N channel material 112, for instance in terms of a bridge lattice constant or amount of defects. For example, a semiconductor that includes aluminum, gallium, and nitrogen (e.g., AlGaN) or a semiconductor that includes aluminum and nitrogen (e.g., AlN) may be used as the buffer material 116 when the III-N channel material 112 is a semiconductor that includes gallium and nitrogen (e.g., GaN). Other examples of materials for the buffer material 116 may include materials typically used as ILD, described above, such as oxide isolation layers, e.g., silicon oxide, silicon nitride, aluminum oxide, and/or silicon oxynitride. When used in the IC structure 100, the buffer material 116 may have a thickness between about 100 and 5000 nanometers, including all values and ranges therein, e.g., between about 200 and 1000 nanometers, or between about 250 and 500 nanometers.

FIG. 1 further illustrates an example transmission line 124, provided above the insulator material 110 above at least some of the portions 122 of the stack of the polarization material 114 over the III-N channel material 112. In some embodiments, a thickness of the insulator material 110 between the transmission line 124 and the polarization material 114 of the one or more portions 122 may be between about 2 micrometers and 20 micrometers, including all values and ranges therein, e.g., between about 2 micrometers and 10 micrometers, or between about 4 micrometers and 7 micrometers.

As shown in FIG. 1, the transmission line 124 may be made of the electrically conductive material 118. In various embodiments, the electrically conductive material 118 may include any suitable electrically conductive material, alloy, or a stack of multiple electrically conductive materials. In some embodiments, the electrically conductive material 118 may include one or more metals or metal alloys, with metals such as copper, ruthenium, palladium, platinum, cobalt, nickel, hafnium, zirconium, titanium, tantalum, and aluminum, tantalum nitride, titanium nitride, tungsten, doped silicon, doped germanium, or alloys and mixtures of these. In some embodiments, the electrically conductive material 118 may include one or more electrically conductive alloys, oxides, or carbides of one or more metals. In some embodiments, the electrically conductive material 118 may include a doped semiconductor, such as silicon or another semiconductor doped with an N-type dopant atom or a P-type dopant atom. Metals may provide higher conductivity, while doped semiconductors may be easier to pattern during fabrication. Although not specifically shown in FIG. 1, in some embodiments, the electrically conductive material 118 may be covered with a cover material, e.g., silicon nitride (SiN), that may act as a sealant, helping to reduce or avoid degradation (e.g., by oxidation) of the electrically conductive material 118 of the transmission line 124.

In general, the transmission line 124 may have any suitable dimensions and shape to support propagation of RF signals. For example, in some embodiments, a thickness of the transmission line 124 may be between about 2 micrometers and 10 micrometers, including all values and ranges therein, e.g., between about 2 micrometers and 5 micrometers, or between about 2.5 micrometers and 3.5 micrometers. In some embodiments, a length (i.e., a dimension measured in directions of propagation of an RF signal in the transmission line) of the transmission line 124 may be at least about 200 micrometers, including all values and ranges therein, e.g., at least about 300 micrometers, or at least about 450 micrometers. In some embodiments, a width (i.e., a dimension measured perpendicular to the length of the transmission line and in a plane parallel to the support structure) of the transmission line 124 may be between about 10 micrometers and 100 micrometers, including all values and ranges therein, e.g., between about 20 micrometers and 75 micrometers, or between about 25 micrometers and 45 micrometers. It should be noted that, while the transmission line 124 is shown as a straight line in FIG. 1, in general, the transmission line 124 may have curves and/or wiggles in the x-y plane of the example coordinate system shown in FIG. 1, in any suitable shape for propagation of RF signals. In some embodiments, the transmission line may form a grid-like or a mesh structure and may extend the combined width beyond 100 micrometers.

Although not specifically shown in FIG. 1, in some embodiments, the electrically conductive material 118 may be covered with a cover material, e.g., silicon nitride (SiN), that may act as a protective sealant, helping to reduce or avoid degradation (e.g., by oxidation) of the electrically conductive material 118 of the transmission line 124.

Now turning to the details of the shield material 120, in various embodiments, the shield material 120 may be any material that is sufficiently electrically conductive so that it can provide an electromagnetic shield to reduce or eliminate coupling between the transmission line 124 and the 2DEG in the III-N channel material 112 or any stray charges that may be present in the III-N channel material 112 or in the polarization material 114 (e.g., stray charges due to residue oxygen impurities in these materials). In some embodiments, the shield material 120 may include one or more metals or metal alloys, such as any metals listed above with reference to the electrically conductive material 118. In some embodiments, the shield material 120 may include one or more doped semiconductor materials having a dopant concentration of at least $10^{16}$ dopant atoms (#) per cubic centimeter ($cm^3$), including all values and ranges therein, e.g., of at least $10^{18}$ #/$cm^3$, or of at least $10^{20}$#/$cm^3$. For example, in some embodiments, the shield material 120 may include a semiconductor material that include gallium and nitrogen (e.g., GaN or InGaN), doped with N-type dopant atoms such as silicon and germanium. In some embodiments, the shield material 120 may include any doped semiconductor materials listed above with reference to the electrically conductive material 118.

FIG. 1 illustrates that, in some embodiments, the shield material 120 may be provided to cover all portions of the polarization material 114 that are below the transmission line 124. However, in other embodiments of the IC structure 100, some portions of the polarization material 114 below the transmission line 124 may remain uncovered by the shield material 120.

FIG. 1 further illustrates that, in some embodiments, the shield material 120 may be provided only over the portions of the polarization material 114 that are below the transmission line 124 but not over other materials of the IC structure 100. However, in other embodiments of the IC structure 100, the shield material 120 may also be provided over other materials of the IC structure 100. For example, in some embodiments, the shield material 120 may be provided as a continuous layer under the transmission line 124. For the example shown in FIG. 1, this may mean that the shield material 120 may be provided as a continuous layer covering the portions 122 and provided over the insulator material 110 between the portions 122 under the transmission line 124.

Still further, FIG. 1 illustrates that, in some embodiments, the shield material 120 may be in contact with the polarization material 114. However, in other embodiments of the IC structure 100, some intermediate materials may be present between the shield material 120 and portions of the polarization material 114 below the transmission line 124. In various embodiments, the insulator material 110 may be in contact with the upper surface of the shield material 120 (i.e., the surface that is farthest away from the support structure 108).

In any of the embodiments, a thickness of the shield material 120 may be at least 50 nanometers, e.g., between about 50 nanometers and 2 micrometers, including all values and ranges therein, e.g., between about 100 nanometers and 1 micrometer.

Although not specifically shown in FIG. 1, the IC structure 100 may further include additional transmission lines similar to the transmission line 102 as described above, as well as one or more III-N transistors that include a stack of the III-N channel material 112 and the polarization material 114 so that the 2DEG in the III-N channel material 112 may be used in the channel region of the transistors. In some embodiments, the IC structure 100 may be included in, or used to implement at least a portion of an RF device, e.g., a portion of an RF FE, e.g., a portion of an RF switch. In some embodiments, the transmission line 124 as well as one or more III-N transistors of the IC structure 100 may be included in, or used to implement at least a portion of an RF circuit or a part of a power circuit.

Figure 2:
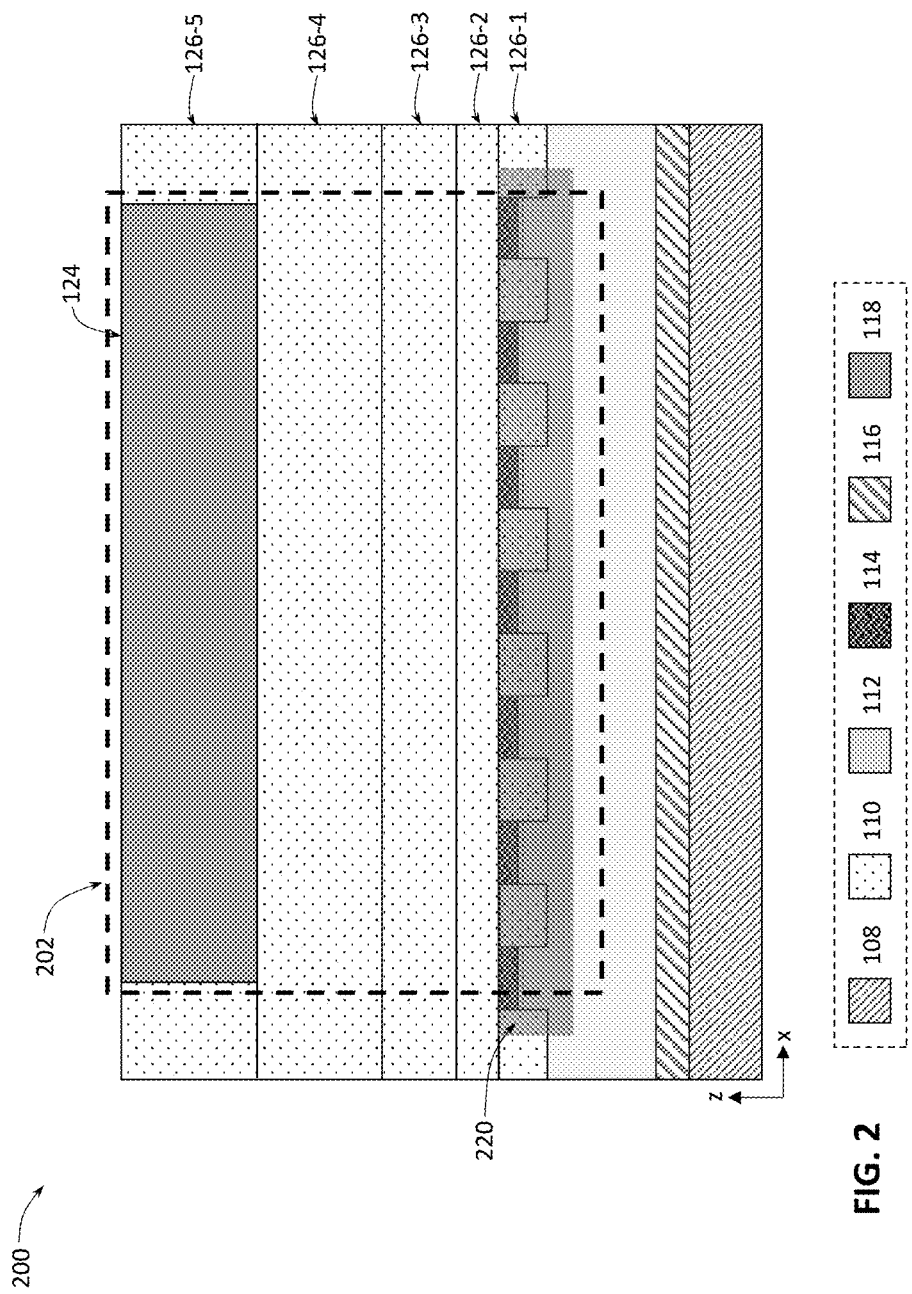
FIG. 2 provides a cross-sectional side view illustrating an IC structure that includes a transmission line structure with implanted dopant atoms, according to some embodiments of the present disclosure.

Transmission Line Structures with Dopant Atoms in the Polarization Layer and III-N Channel Material The second embodiment of the present disclosure, illustrated in FIG. 2, is based on recognition that providing dopant atoms implanted into one or more portions of the polarization material present below the transmission line, as well as into at least the upper layer of the III-N channel material underneath such portions of the polarization material, may also reduce or eliminate nonlinear coupling to the transmission line. In particular, providing sufficient concentration of implanted dopant atoms in the III-N channel material will damage the crystalline lattice of the III-N channel material, making it semi-insulating or insulating. As a result, the 2DEG, as well as any residual stray charges (e.g., from unintentional impurities such as oxygen), which may otherwise be present in the III-N channel material under the transmission line may be reduced or eliminated, thereby reducing or eliminating nonlinear coupling to the transmission line.

FIG. 2 provides a cross-sectional side view illustrating an IC structure 200 that includes a transmission line structure 202 with implanted dopant atoms, according to some embodiments of the present disclosure. The IC structure 200 of FIG. 2 is similar to the IC structure 100 of FIG. 1 where the same reference numerals illustrate analogous elements. Therefore, in the interests of brevity, unless specified otherwise, descriptions provided for the IC structure 100 shown in FIG. 1 are assumed to be applicable to the IC structure 200 shown in FIG. 2 and are not repeated, and only the differences between these IC structures are described.

The transmission line structure 202 shown in FIG. 2 is similar to the transmission line structure 102 shown in FIG. 1, except that, instead of providing the shield material 120 as was described with reference to the transmission line structure 102, the transmission line structure 202 includes a layer of dopant atoms implanted in the polarization material 114 and at least the upper portion of the III-N channel material 112. An approximate boundary of such a layer of dopant atoms is illustrated in FIG. 2 as a dopant atom layer 220 (shown in FIG. 2 as gray shading that illustrates areas where dopant atoms are to be provided), although it is to be understood that, in real-life structures, the boundary of where the implanted dopant atoms stop may not necessarily be as abrupt as that of the boundary of the layer 220.

In order to achieve that the crystalline lattice of the III-N channel material 112 is sufficiently damaged so that the III-N channel material 112 becomes semi-insulating or insulating and the charges therein (either 2DEG or stray charges) no longer contribute to nonlinear coupling to the transmission line 124, or at least that such coupling is reduced, dopant atoms are to be implanted into the polarization material 114 and at least in the upper portion of the III-N channel material 112. For example, in some embodiments, a thickness of the portion of the III-N channel material 112 that is doped with the dopant atoms may be at least about 2 nanometers, including all values and ranges therein, e.g., at least about 3 nanometers, or between about 2-3 nanometers and 500 nanometers. Thus, a total thickness of the dopant atom layer 220 may be substantially equal to the sum of such a thickness of the upper portion of the III-N channel material 112 and a thickness of the polarization layer 114.

In some embodiments, dopant atoms of the layer 220 may have a dopant concentration of at least $10^{15}$ #/cm$^3$, including all values and ranges therein, e.g., of at least $10^{18}$ #/cm$^3$, or of at least $10^{20}$ #/cm$^3$. In various embodiments, such dopant atoms may include, e.g., hydrogen, argon, and/or fluorine atoms.

Further Variations and Implementations

The IC structures 100/200 illustrated in FIGS. 1-2, with possible further modifications to such structures, e.g., as described above, do not represent an exhaustive set of assemblies in which at least one transmission line structure 102/202 as described herein may be integrated on a substrate with a stack of the polarization material 114 over the III-N channel material 112 used to implement one or more III-N devices, e.g., with one or more III-N transistors, but merely provide examples of such structures/assemblies. For example, in further embodiments of the IC structures as shown in FIGS. 1-2, the transmission line 102/202 may be electrically coupled to one or more III-N transistors and/or to one or more RF signal ports. In another example, although particular arrangements of materials are discussed with reference to FIGS. 1-2, intermediate materials may be included in various portions of these figures, e.g. a hardmask material such as silicon nitride may be deposited over the polarization material 114. In yet another example, although not specifically shown in FIGS. 1-2, embodiments of these two figures could be combined so that a transmission line structure includes, both, the shield material 120 as described with reference to FIG. 1 and the dopant atom layer 220 as described with reference to FIG. 2.

FIGS. 1-2 are intended to show relative arrangements of some of the components therein, and that various device components of these figures may include other components that are not specifically illustrated, e.g., various interfacial layers or various additional layers or elements. For example, although not specifically shown, the IC structures 100/200 may include a solder resist material (e.g., polyimide or similar material) and one or more bond pads formed on upper-most interconnect layer of the IC structure, e.g., at the top of the IC structures 100/200 shown in FIGS. 1-2. The bond pads may be electrically coupled with a further interconnect structure and configured to route the electrical signals between, e.g., the transmission line 102/202 and III-N transistors/devices, or between the transmission line 102/202 and external devices, and/or between the different transmission lines 102/202. In some embodiments, solder bonds may be formed on the one or more bond pads to mechanically and/or electrically couple a chip including the IC structure 100/200 with another component (e.g., a circuit board). The IC structure 100/200 may have other alternative configurations to route the electrical signals from the interconnect layers, e.g., the bond pads described above may be replaced by or may further include other analogous features (e.g., posts) that route the electrical signals to external components.

Additionally, although some elements of the IC structures are illustrated in FIGS. 1-2 as being planar rectangles or formed of rectangular solids, this is simply for ease of illustration, and embodiments of various ones of these elements may be curved, rounded, or otherwise irregularly shaped as dictated by, and sometimes inevitable due to, the manufacturing processes used to fabricate semiconductor device assemblies. For example, while FIGS. 1-2 may illustrate some elements, e.g., the portions 122, the transmission line 124, etc., as having perfectly straight sidewall profiles, i.e., profiles where the sidewalls extend perpendicularly to the support structure 108, these idealistic profiles may not always be achievable in real-world manufacturing processes. Namely, while designed to have straight sidewall profiles, real-world openings that may be formed as a part of fabricating various elements of the IC structures shown in FIGS. 1-2 may end up having either so-called "re-entrant" profiles, where the width at the top of the opening is smaller than the width at the bottom of the opening, or "non-re-entrant" profile, where the width at the top of the opening is larger than the width at the bottom of the opening. Oftentimes, as a result of a real-world opening not having perfectly straight sidewalls, imperfections may form within the materials filling the opening. For example, typical for re-entrant profiles, a void may be formed in the center of the opening, where the growth of a given material filling the opening pinches off at the top of the opening. Therefore, present descriptions of various embodiments of integrating one or more transmission line structures on substrates use to house one or more III-N transistors are equally applicable to embodiments where various elements of such integrated structures look different from those shown in the figures due to manufacturing processes used to form them.

Inspection of layout and mask data and reverse engineering of parts of a device to reconstruct the circuit using e.g., optical microscopy, TEM, or SEM, and/or inspection of a cross-section of a device to detect the shape and the location of various device elements described herein using e.g., Physical Failure Analysis (PFA) would allow determination of the integration of at least one transmission line structure with one or more III-N devices as described herein.

Manufacturing IC Structures Having III-N Transistors with Local Stressors

Figure 3:
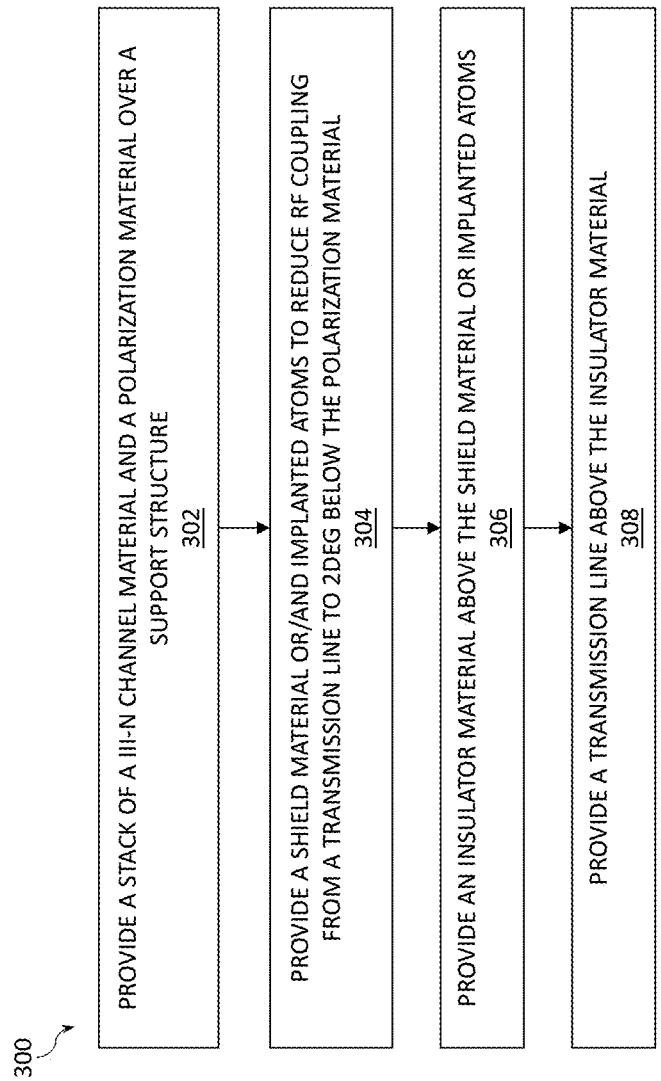
FIG. 3 is a flow diagram of an example method of manufacturing an IC structure that includes a transmission line structure for a III-N device, in accordance with various embodiments of the present disclosure.

The IC structures implementing at least one transmission line structure integrated with one or more III-N devices as described herein may be manufactured using any suitable techniques. FIG. 3 illustrates an example of such a method. However, other examples of manufacturing any of the IC structures described herein, as well as larger devices and assemblies that include such structures (e.g., as shown in FIGS. 6-9) are also within the scope of the present disclosure.

FIG. 3 is a flow diagram of an example method 300 of manufacturing an IC structure that includes a transmission line structure for a III-N device, in accordance with some embodiments of the present disclosure.

Although the operations of the method 300 are illustrated once each and in a particular order, the operations may be performed in any suitable order and repeated as desired. For example, one or more operations may be performed in parallel to manufacture, substantially simultaneously, multiple transmission line structures as described herein. In another example, the operations may be performed in a different order to reflect the structure of a particular device assembly in which one or more transmission line structures as described herein will be included.

In addition, the example manufacturing method 300 may include other operations not specifically shown in FIG. 3, such as various cleaning or planarization operations as known in the art. For example, in some embodiments, the support structure 108, as well as layers of various other materials subsequently deposited thereon, may be cleaned prior to, after, or during any of the processes of the method 300 described herein, e.g., to remove oxides, surface-bound organic and metallic contaminants, as well as subsurface contamination. In some embodiments, cleaning may be carried out using e.g., a chemical solutions (such as peroxide), and/or with ultraviolet (UV) radiation combined with ozone, and/or oxidizing the surface (e.g., using thermal oxidation) then removing the oxide (e.g., using hydrofluoric acid (HF)). In another example, the structures/assemblies described herein may be planarized prior to, after, or during any of the processes of the method 300 described herein, e.g., to remove overburden or excess materials. In some embodiments, planarization may be carried out using either wet or dry planarization processes, e.g., planarization be a chemical mechanical planarization (CMP), which may be understood as a process that utilizes a polishing surface, an abrasive and a slurry to remove the overburden and planarize the surface.

Various operations of the method 300 may be illustrated with reference to the example embodiments shown in FIGS. 4A-4E, illustrating fabrication of IC structures as shown in FIGS. 1 and 2, but the method 300 may be used to manufacture any suitable IC structures having one or more transmission line structures integrated with one or more III-N devices according to any other embodiments of the present disclosure. FIGS. 4A-4E illustrate cross-sectional side views similar to the views shown in FIGS. 1 and 2, in various example stages in the manufacture of IC structures using the method of FIG. 3 in accordance with some embodiments of the present disclosure.

Figure 4A:
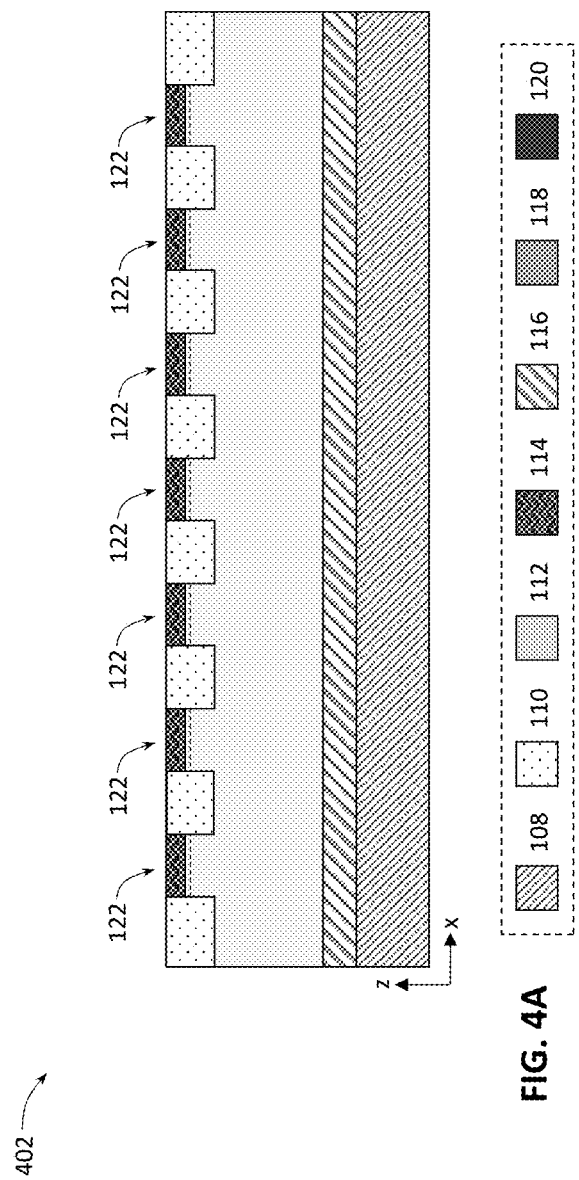

The method 300 may begin with providing a channel stack for the future III-N devices, the channel stack including a layer of a III-N channel material over a support structure and a layer of a polarization material over the III-N channel material (process 302 shown in FIG. 3, a result of which is illustrated with an IC structure 402 shown in FIG. 4A). The process 302 may include patterning the channel stack to define various areas for the future III-N devices, and may further include forming at least portions of such devices, e.g. forming source and drain (S/D) regions in the channel stack, for forming one or more III-N transistors. As a result, some portions of the stack may be left in areas not designated for forming III-N devices, which could be areas over which a transmission line is to be provided in a higher metallization layer. Such portions may be portions 122 as described above, as shown in the IC structure 402 of FIG. 4A. The IC structure 402 illustrates that the support structure provided in 302 may be the support structure 108 as described above. The IC structure 402 further illustrates that, first, optionally, the buffer material 116 may be provided over the support structure 108, and then the III-N channel material 112 may be provided over the buffer material 116, and then the polarization material 114 may be provided over the III-N channel material 112, as also shown in FIG. 4A.

In some embodiments, the process 302 may include epitaxially growing various semiconductor, e.g., for forming the buffer material 116, the III-N channel material 112, and the polarization material 114. In this context, "epitaxial growth" refers to the deposition of crystalline overlayers in the form of the desired materials. The epitaxial growth of various layers of the process 302 may be carried out using any known gaseous or liquid precursors for forming the desired material layers.

Figure 4B:
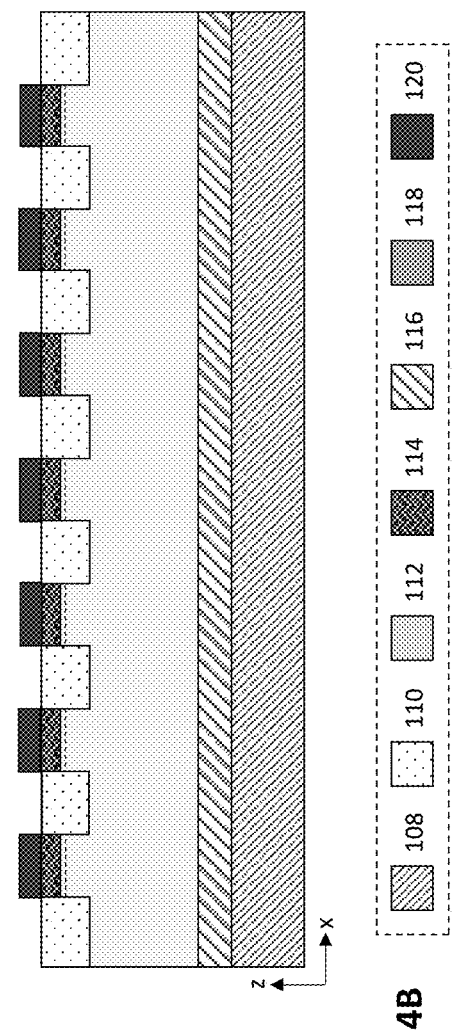

The method 300 may then include providing a shield material or/and dopant atoms to reduce RF coupling from the 2DEG below the polarization material to the [future] transmission line to be provided above (process 304 shown in FIG. 3, a result of which is illustrated with an IC structure 404-1 shown in FIG. 4B for the first embodiment of the present disclosure and with an IC structure 404-2 shown in FIG. 4C for the second embodiment of the present disclosure). The IC structure 404-1 of FIG. 4B illustrates that the process 304 may include providing the shield material 120 over at least some portions of the polarization material 114, as described above with reference to FIG. 1. In various embodiments, depending on the material used for the shield material 120, providing the shield material 120 may include processes such as epitaxial deposition, atomic layer deposition (ALD), physical vapor deposition (PVD) (e.g., evaporative deposition, magnetron sputtering, or e-beam deposition), or chemical vapor deposition (CVD). The IC structure 404-2 of FIG. 4C illustrates that the process 304 may include providing the dopant atom layer 220 over at least some portions of the polarization material 114 and the upper portion of the III-N channel material 112, as described above with reference to FIG. 2. In various embodiments, dopant atoms of the layer 220 may be provided using ion implantation.

In some embodiments, any of the processes 302 and 304 may include patterning to shape any of the channel stack, the shield material, and/or the dopant atom layer in the desired geometry. For example, at least some portions of the channel stack may be shaped to form islands (e.g., so that such a portion of the channel stack is surrounded by an insulator, e.g. the insulator 110, as shown with the portions 122). Examples of patterning techniques that may be used in any of the processes 302 and 304 may include, but are not limited to, photolithographic or electron-beam (e-beam) patterning, possibly in conjunction with a suitable etching technique, e.g., a dry etch, such as RF reactive ion etch (RIE) or inductively coupled plasma (ICP) RIE. In various embodiments, any of the etches performed in any of the processes 302 and 304 may include an anisotropic etch. Some anisotropic etches may use etchants that take the form of a chemically active ionized gas (e.g., plasma). Some such etchants may have a bromine-based chemistry or a chlorine-based chemistry. In some embodiments, during any of the etches of any of the processes 302 and 304, the IC structure may be heated to elevated temperatures, e.g., to temperatures between about room temperature and 200 degrees Celsius, including all values and ranges therein, to promote that byproducts of the etch are made sufficiently volatile to be removed from the surface.

Figure 4E:
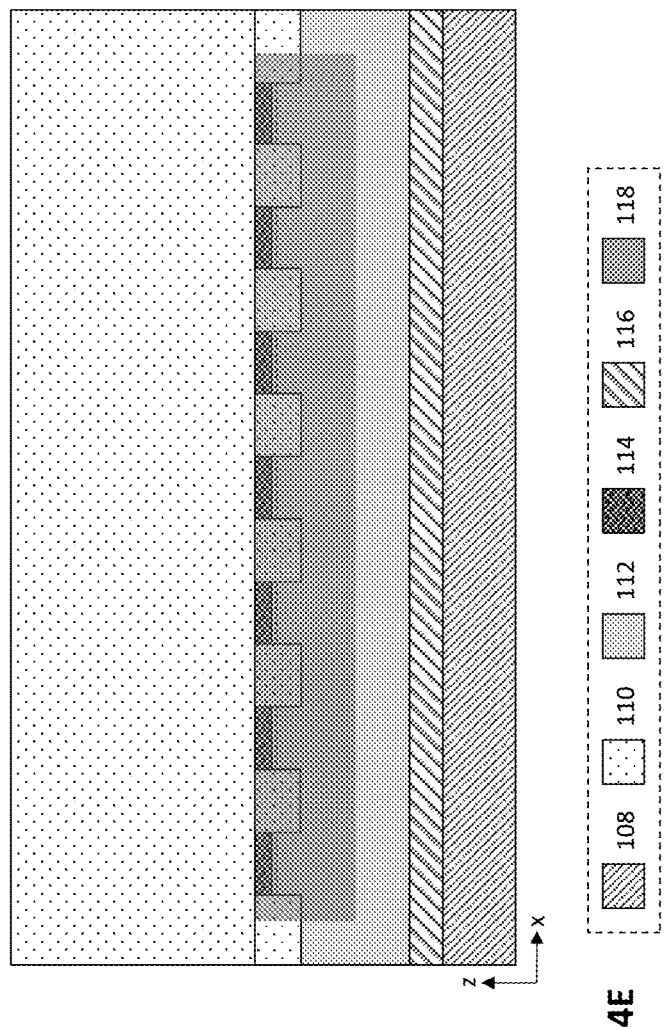

The method 300 may then include providing an insulator material over the shield material or/and dopant atoms that were provided in the process 304 (process 306 shown in FIG. 3, a result of which is illustrated with an IC structure 406-1 shown in FIG. 4D for the first embodiment of the present disclosure and with an IC structure 406-2 shown in FIG. 4E for the second embodiment of the present disclosure). The IC structure 406-1 of FIG. 4D illustrates that the process 306 may include providing the insulator material 110 over the shield material 120 provided in the process 304, as described above with reference to FIG. 1. The IC structure 406-2 of FIG. 4E illustrates that the process 306 may include providing the insulator material 110 over the dopant atom layer 220 provided in the process 304, as described above with reference to FIG. 2. In various embodiments, providing the insulator material in the process 306 may include dip-coating, spin-coating, ALD, PVD, or CVD.

The method 300 may then proceed with providing a transmission line over the insulator material provided in the process 306 (process 308 shown in FIG. 3, a result of which is not illustrated in FIGS. 4A-4E because the result could be the IC structure 100 as shown in FIG. 1 for the first embodiment of the present disclosure or the IC structure 200 as shown in FIG. 1 for the second embodiment of the present disclosure). Any suitable deposition and patterning techniques may be used in the process 308 to form the transmission line at the desired location and of the desired geometry, e.g., the transmission line 124 as described above. Examples of deposition techniques that may be used to deposit the electrically conductive material 118 of the transmission line 124 in the process 308 include, but are not limited to, ALD, PVD, CVD, or electroplating. The process 308 may include patterning the electrically conductive material 118 to form the transmission line 124 of the desired location and geometry using any of the patterning techniques described above.

Example Structures and Devices with Transmission Line Structures for III-N Devices IC structures that include at least one transmission line structure integrated with one or more III-N devices as disclosed herein may be included in any suitable electronic device. FIGS. 5-9 illustrate various examples of devices and components that may include one or more transmission line structures with shield material and/or dopant atom layer as disclosed herein.

Figure 5B:
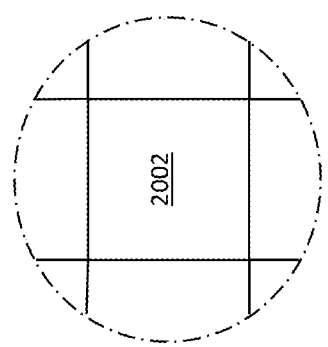
FIGS. 5A-5B are top views of a wafer and dies that include one or more IC structures having at least one transmission line structure integrated with one or more III-N devices in accordance with any of the embodiments of the present disclosure.
Figure 5A:
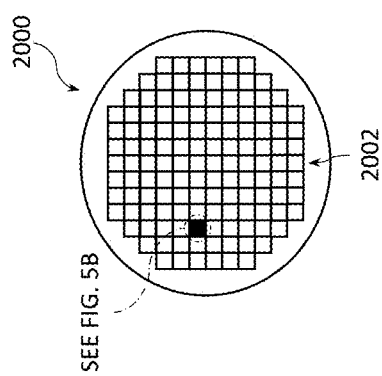

FIGS. 5A-5B are top views of a wafer 2000 and dies 2002 that may include at least one transmission line structure integrated with one or more III-N devices in accordance with any of the embodiments disclosed herein. In some embodiments, the dies 2002 may be included in an IC package, in accordance with any of the embodiments disclosed herein. For example, any of the dies 2002 may serve as any of the dies 2256 in an IC package 2200 shown in FIG. 6. The wafer 2000 may be composed of semiconductor material and may include one or more dies 2002 having IC structures formed on a surface of the wafer 2000. Each of the dies 2002 may be a repeating unit of a semiconductor product that includes any suitable IC (e.g., ICs including at least one transmission line structure integrated with one or more III-N devices as described herein). After the fabrication of the semiconductor product is complete (e.g., after manufacture of at least one transmission line structure integrated with one or more III-N devices as described herein, e.g., after manufacture of any embodiment of the IC structures 100/200 described herein), the wafer 2000 may undergo a singulation process in which each of the dies 2002 is separated from one another to provide discrete "chips" of the semiconductor product. In particular, devices that include one or transmission line structures with shield material and/or dopant atom layer as disclosed herein may take the form of the wafer 2000 (e.g., not singulated) or the form of the die 2002 (e.g., singulated). The die 2002 may include one or more transmission line structures with shield material and/or dopant atom layer (e.g., one or more transmission line structures 102 or 202 as described herein), one or more III-N devices, e.g., III-N transistors, as well as, optionally, supporting circuitry to route electrical signals to the transmission line structures and/or the III-N transistors, as well as any other IC components. In some embodiments, the wafer 2000 or the die 2002 may implement an RF FE device, a memory device (e.g., a static random-access memory (SRAM) device), a logic device (e.g., an AND, OR, NAND, or NOR gate), or any other suitable circuit element. Multiple ones of these devices may be combined on a single die 2002.

Figure 6:
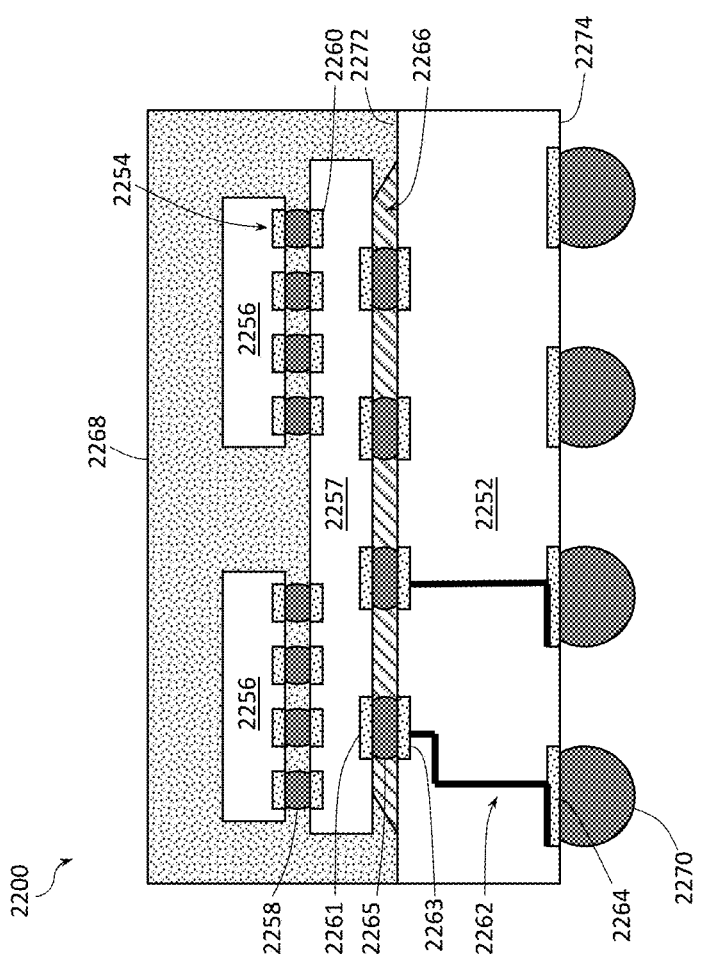
FIG. 6 is a cross-sectional side view of an IC package that may include one or more IC structures having at least one transmission line structure integrated with one or more III-N devices in accordance with any of the embodiments of the present disclosure.

FIG. 6 is a side, cross-sectional view of an example IC package 2200 that may include one or more IC structures having at least one transmission line structure integrated with one or more III-N devices in accordance with any of the embodiments disclosed herein. In some embodiments, the IC package 2200 may be a system-in-package (SiP).

As shown in FIG. 6, the IC package 2200 may include a package substrate 2252. The package substrate 2252 may be formed of a dielectric material (e.g., a ceramic, a glass, a combination of organic and inorganic materials, a buildup film, an epoxy film having filler particles therein, etc., and may have embedded portions having different materials), and may have conductive pathways extending through the dielectric material between the face 2272 and the face 2274, or between different locations on the face 2272, and/or between different locations on the face 2274.

The package substrate 2252 may include conductive contacts 2263 that are coupled to conductive pathways 2262 through the package substrate 2252, allowing circuitry within the dies 2256 and/or the interposer 2257 to electrically couple to various ones of the conductive contacts 2264 (or to other devices included in the package substrate 2252, not shown).

The IC package 2200 may include an interposer 2257 coupled to the package substrate 2252 via conductive contacts 2261 of the interposer 2257, first-level interconnects 2265, and the conductive contacts 2263 of the package substrate 2252. The first-level interconnects 2265 illustrated in FIG. 6 are solder bumps, but any suitable first-level interconnects 2265 may be used. In some embodiments, no interposer 2257 may be included in the IC package 2200; instead, the dies 2256 may be coupled directly to the conductive contacts 2263 at the face 2272 by first-level interconnects 2265.

The IC package 2200 may include one or more dies 2256 coupled to the interposer 2257 via conductive contacts 2254 of the dies 2256, first-level interconnects 2258, and conductive contacts 2260 of the interposer 2257. The conductive contacts 2260 may be coupled to conductive pathways (not shown) through the interposer 2257, allowing circuitry within the dies 2256 to electrically couple to various ones of the conductive contacts 2261 (or to other devices included in the interposer 2257, not shown). The first-level interconnects 2258 illustrated in FIG. 6 are solder bumps, but any suitable first-level interconnects 2258 may be used. As used herein, a "conductive contact" may refer to a portion of electrically conductive material (e.g., metal) serving as an interface between different components; conductive contacts may be recessed in, flush with, or extending away from a surface of a component, and may take any suitable form (e.g., a conductive pad or socket).

In some embodiments, an underfill material 2266 may be disposed between the package substrate 2252 and the interposer 2257 around the first-level interconnects 2265, and a mold compound 2268 may be disposed around the dies 2256 and the interposer 2257 and in contact with the package substrate 2252. In some embodiments, the underfill material 2266 may be the same as the mold compound 2268. Example materials that may be used for the underfill material 2266 and the mold compound 2268 are epoxy mold materials, as suitable. Second-level interconnects 2270 may be coupled to the conductive contacts 2264. The second-level interconnects 2270 illustrated in FIG. 6 are solder balls (e.g., for a ball grid array arrangement), but any suitable second-level interconnects 22770 may be used (e.g., pins in a pin grid array arrangement or lands in a land grid array arrangement). The second-level interconnects 2270 may be used to couple the IC package 2200 to another component, such as a circuit board (e.g., a motherboard), an interposer, or another IC package, as known in the art and as discussed below with reference to FIG. 7.

The dies 2256 may take the form of any of the embodiments of the die 2002 discussed herein and may include any of the embodiments of an IC structure having at least one transmission line structure with a shield material and/or a dopant atom layer, e.g., any of the IC structures 100 or 200, described herein. In embodiments in which the IC package 2200 includes multiple dies 2256, the IC package 2200 may be referred to as a multi-chip-package (MCP). The dies 2256 may include circuitry to perform any desired functionality. For example, one or more of the dies 2256 may be RF FE dies, including one or more transmission line structures with a shield material and/or a dopant atom layer integrated with one or more III-N devices in a single die as described herein, one or more of the dies 2256 may be logic dies (e.g., silicon-based dies), one or more of the dies 2256 may be memory dies (e.g., high bandwidth memory), etc. In some embodiments, any of the dies 2256 may include at least one transmission line structure integrated with one or more III-N devices, e.g., as discussed above; in some embodiments, at least some of the dies 2256 may not include any transmission line structures with a shield material and/or a dopant atom layer as described herein.

The IC package 2200 illustrated in FIG. 6 may be a flip chip package, although other package architectures may be used. For example, the IC package 2200 may be a ball grid array (BGA) package, such as an embedded wafer-level ball grid array (eWLB) package. In another example, the IC package 2200 may be a wafer-level chip scale package (WLCSP) or a panel fan-out (FO) package. Although two dies 2256 are illustrated in the IC package 2200 of FIG. 6, an IC package 2200 may include any desired number of the dies 2256. An IC package 2200 may include additional passive components, such as surface-mount resistors, capacitors, and inductors disposed on the first face 2272 or the second face 2274 of the package substrate 2252, or on either face of the interposer 2257. More generally, an IC package 2200 may include any other active or passive components known in the art.

Figure 7:
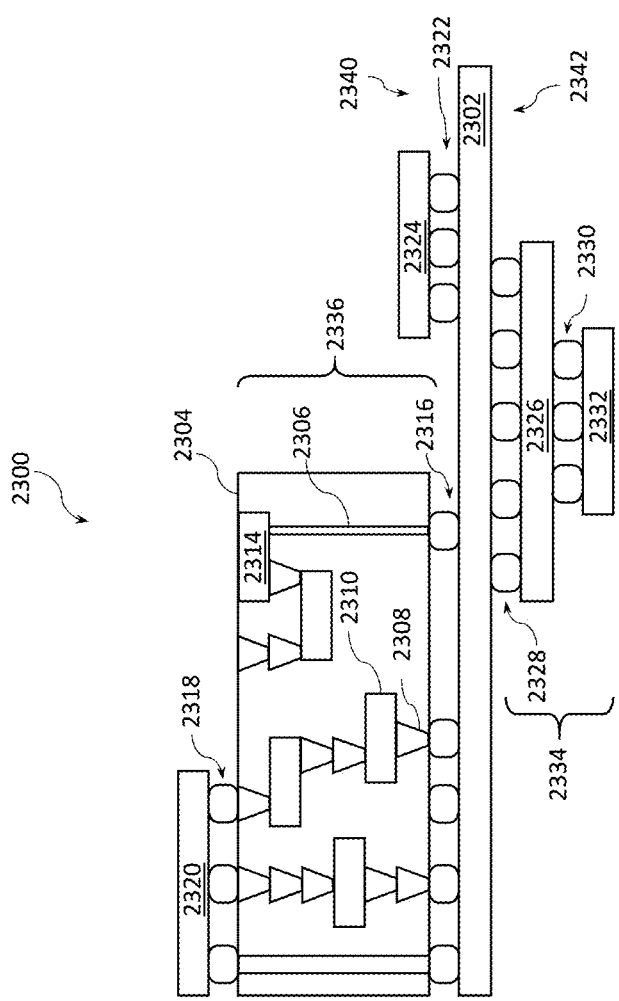
FIG. 7 is a cross-sectional side view of an IC device assembly that may include one or more IC structures having at least one transmission line structure integrated with one or more III-N devices in accordance with any of the embodiments of the present disclosure.

FIG. 7 is a cross-sectional side view of an IC device assembly 2300 that may include components having one or more IC structures implementing at least one transmission line structure integrated with one or more III-N devices in accordance with any of the embodiments disclosed herein. The IC device assembly 2300 includes a number of components disposed on a circuit board 2302 (which may be, e.g., a motherboard). The IC device assembly 2300 includes components disposed on a first face 2340 of the circuit board 2302 and an opposing second face 2342 of the circuit board 2302; generally, components may be disposed on one or both faces 2340 and 2342. In particular, any suitable ones of the components of the IC device assembly 2300 may include any of the IC structures implementing at least one transmission line structure integrated with one or more III-N devices in accordance with any of the embodiments disclosed herein; e.g., any of the IC packages discussed below with reference to the IC device assembly 2300 may take the form of any of the embodiments of the IC package 2200 discussed above with reference to FIG. 6 (e.g., may include at least one transmission line structure integrated with one or more III-N devices in/on a die 2256).

In some embodiments, the circuit board 2302 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 2302. In other embodiments, the circuit board 2302 may be a non-PCB substrate.

The IC device assembly 2300 illustrated in FIG. 7 includes a package-on-interposer structure 2336 coupled to the first face 2340 of the circuit board 2302 by coupling components 2316. The coupling components 2316 may electrically and mechanically couple the package-on-interposer structure 2336 to the circuit board 2302, and may include solder balls (e.g., as shown in FIG. 7), male and female portions of a socket, an adhesive, an underfill material, and/or any other suitable electrical and/or mechanical coupling structure.

The package-on-interposer structure 2336 may include an IC package 2320 coupled to an interposer 2304 by coupling components 2318. The coupling components 2318 may take any suitable form for the application, such as the forms discussed above with reference to the coupling components 2316. The IC package 2320 may be or include, for example, a die (the die 2002 of FIG. 5B), an IC device (e.g., the IC structure of FIGS. 1-2), or any other suitable component. In particular, the IC package 2320 may include at least one transmission line structure with a shield material and/or a dopant atom layer as described herein. Although a single IC package 2320 is shown in FIG. 7, multiple IC packages may be coupled to the interposer 2304; indeed, additional interposers may be coupled to the interposer 2304. The interposer 2304 may provide an intervening substrate used to bridge the circuit board 2302 and the IC package 2320. Generally, the interposer 2304 may spread a connection to a wider pitch or reroute a connection to a different connection. For example, the interposer 2304 may couple the IC package 2320 (e.g., a die) to a BGA of the coupling components 2316 for coupling to the circuit board 2302. In the embodiment illustrated in FIG. 7, the IC package 2320 and the circuit board 2302 are attached to opposing sides of the interposer 2304; in other embodiments, the IC package 2320 and the circuit board 2302 may be attached to a same side of the interposer 2304. In some embodiments, three or more components may be interconnected by way of the interposer 2304.

The interposer 2304 may be formed of an epoxy resin, a fiberglass-reinforced epoxy resin, a ceramic material, or a polymer material such as polyimide. In some implementations, the interposer 2304 may be formed of alternate rigid or flexible materials that may include the same materials described above for use in a semiconductor substrate, such as silicon, germanium, and other group III-V and group IV materials. The interposer 2304 may include metal interconnects 2308 and vias 2310, including but not limited to through-silicon vias (TSVs) 2306. The interposer 2304 may further include embedded devices 2314, including both passive and active devices. Such devices may include, but are not limited to, capacitors, decoupling capacitors, resistors, inductors, fuses, diodes, transformers, sensors, electrostatic discharge (ESD) protection devices, and memory devices. More complex devices such as further RF devices, PAs, power management devices, antennas, arrays, sensors, and microelectromechanical systems (MEMS) devices may also be formed on the interposer 2304. In some embodiments, the IC structures implementing at least one transmission line structure with a shield material and/or a dopant atom layer as described herein may also be implemented in/on the interposer 2304. The package-on-interposer structure 2336 may take the form of any of the package-on-interposer structures known in the art.

The IC device assembly 2300 may include an IC package 2324 coupled to the first face 2340 of the circuit board 2302 by coupling components 2322. The coupling components 2322 may take the form of any of the embodiments discussed above with reference to the coupling components 2316, and the IC package 2324 may take the form of any of the embodiments discussed above with reference to the IC package 2320.

The IC device assembly 2300 illustrated in FIG. 7 includes a package-on-package structure 2334 coupled to the second face 2342 of the circuit board 2302 by coupling components 2328. The package-on-package structure 2334 may include an IC package 2326 and an IC package 2332 coupled together by coupling components 2330 such that the IC package 2326 is disposed between the circuit board 2302 and the IC package 2332. The coupling components 2328 and 2330 may take the form of any of the embodiments of the coupling components 2316 discussed above, and the IC packages 2326 and 2332 may take the form of any of the embodiments of the IC package 2320 discussed above. The package-on-package structure 2334 may be configured in accordance with any of the package-on-package structures known in the art.

Figure 8:
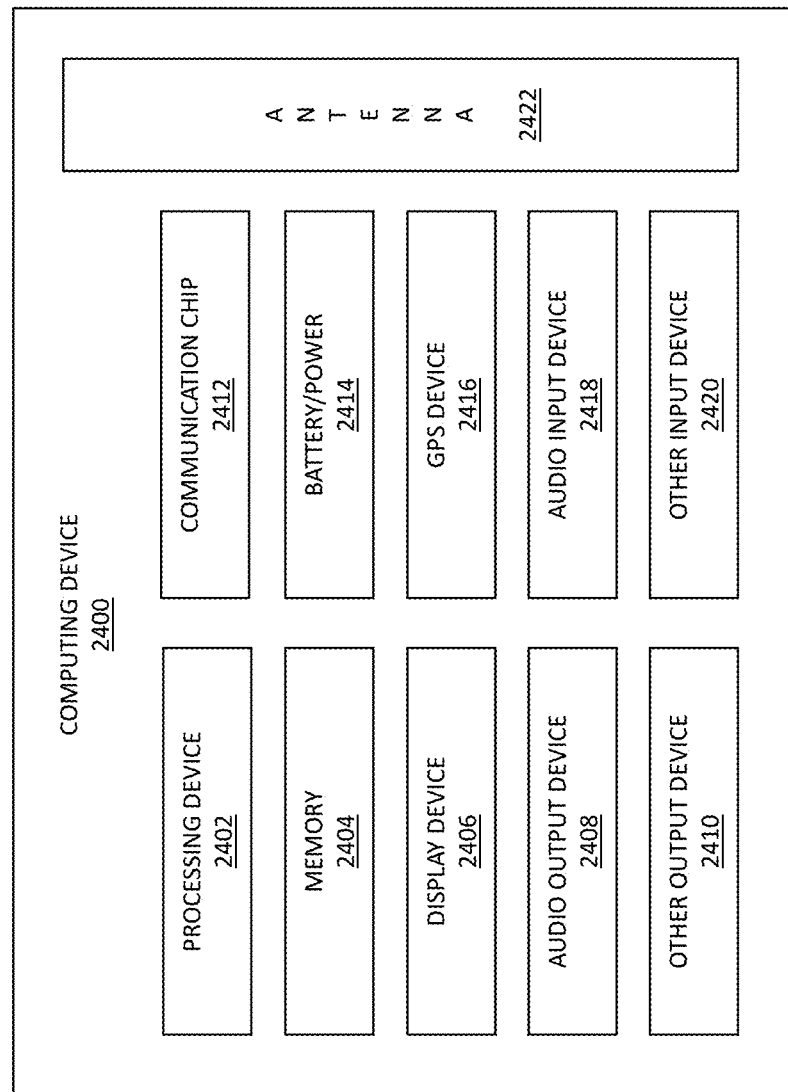
FIG. 8 is a block diagram of an example computing device that may include one or more IC structures having at least one transmission line structure integrated with one or more III-N devices in accordance with any of the embodiments of the present disclosure.

FIG. 8 is a block diagram of an example computing device 2400 that may include one or more components with one or more IC structures having at least one transmission line structure integrated with one or more III-N devices in accordance with any of the embodiments disclosed herein. For example, any suitable ones of the components of the computing device 2400 may include a die (e.g., the die 2002 (FIG. 5B)) including at least one transmission line structure with a shield material and/or a dopant atom layer in accordance with any of the embodiments disclosed herein. Any of the components of the computing device 2400 may include an IC device (e.g., any embodiment of the IC structure of FIGS. 1-2) and/or an IC package 2200 (FIG. 6). Any of the components of the computing device 2400 may include an IC device assembly 2300 (FIG. 7).

A number of components are illustrated in FIG. 8 as included in the computing device 2400, but any one or more of these components may be omitted or duplicated, as suitable for the application. In some embodiments, some or all of the components included in the computing device 2400 may be attached to one or more motherboards. In some embodiments, some or all of these components are fabricated onto a single SoC die.

Additionally, in various embodiments, the computing device 2400 may not include one or more of the components illustrated in FIG. 8, but the computing device 2400 may include interface circuitry for coupling to the one or more components. For example, the computing device 2400 may not include a display device 2406, but may include display device interface circuitry (e.g., a connector and driver circuitry) to which a display device 2406 may be coupled. In another set of examples, the computing device 2400 may not include an audio input device 2418 or an audio output device 2408, but may include audio input or output device interface circuitry (e.g., connectors and supporting circuitry) to which an audio input device 2418 or audio output device 2408 may be coupled.

The computing device 2400 may include a processing device 2402 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2402 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices. The computing device 2400 may include a memory 2404, which may itself include one or more memory devices such as volatile memory (e.g., DRAM), nonvolatile memory (e.g., read-only memory (ROM)), flash memory, solid-state memory, and/or a hard drive. In some embodiments, the memory 2404 may include memory that shares a die with the processing device 2402. This memory may be used as cache memory and may include, e.g., eDRAM, and/or spin transfer torque magnetic random-access memory (STT-MRAM).

In some embodiments, the computing device 2400 may include a communication chip 2412 (e.g., one or more communication chips). For example, the communication chip 2412 may be configured for managing wireless communications for the transfer of data to and from the computing device 2400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2412 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2412 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2412 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2412 may operate in accordance with other wireless protocols in other embodiments. The computing device 2400 may include an antenna 2422 to facilitate wireless communications and/or to receive other wireless communications (such as AM or FM radio transmissions).

In some embodiments, the communication chip 2412 may manage wired communications, such as electrical, optical, or any other suitable communication protocols (e.g., the Ethernet). As noted above, the communication chip 2412 may include multiple communication chips. For instance, a first communication chip 2412 may be dedicated to shorter-range wireless communications such as Wi-Fi or Bluetooth, and a second communication chip 2412 may be dedicated to longer-range wireless communications such as global positioning system (GPS), EDGE, GPRS, CDMA, WiMAX, LTE, EV-DO, or others. In some embodiments, a first communication chip 2412 may be dedicated to wireless communications, and a second communication chip 2412 may be dedicated to wired communications.

In various embodiments, IC structures as described herein may be particularly advantageous for use within the one or more communication chips 2412, described above. For example, such IC structures, in particular transmission line structures with a shield material and/or a dopant atom layer as described herein, may be used to implement one or more of RF switches, PAs, LNAs, filters (including arrays of filters and filter banks), upconverters, downconverters, and duplexers, e.g., as a part of implementing the communication chips 2412.

The computing device 2400 may include battery/power circuitry 2414. The battery/power circuitry 2414 may include one or more energy storage devices (e.g., batteries or capacitors) and/or circuitry for coupling components of the computing device 2400 to an energy source separate from the computing device 2400 (e.g., AC line power).

The computing device 2400 may include a display device 2406 (or corresponding interface circuitry, as discussed above). The display device 2406 may include any visual indicators, such as a heads-up display, a computer monitor, a projector, a touchscreen display, a liquid crystal display (LCD), a light-emitting diode display, or a flat panel display, for example.

The computing device 2400 may include an audio output device 2408 (or corresponding interface circuitry, as discussed above). The audio output device 2408 may include any device that generates an audible indicator, such as speakers, headsets, or earbuds, for example.

The computing device 2400 may include an audio input device 2418 (or corresponding interface circuitry, as discussed above). The audio input device 2418 may include any device that generates a signal representative of a sound, such as microphones, microphone arrays, or digital instruments (e.g., instruments having a musical instrument digital interface (MIDI) output).

The computing device 2400 may include a GPS device 2416 (or corresponding interface circuitry, as discussed above). The GPS device 2416 may be in communication with a satellite-based system and may receive a location of the computing device 2400, as known in the art.

The computing device 2400 may include an other output device 2410 (or corresponding interface circuitry, as discussed above). Examples of the other output device 2410 may include an audio codec, a video codec, a printer, a wired or wireless transmitter for providing information to other devices, or an additional storage device.

The computing device 2400 may include an other input device 2420 (or corresponding interface circuitry, as discussed above). Examples of the other input device 2420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 2400 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 2400 may be any other electronic device that processes data.

Figure 9:
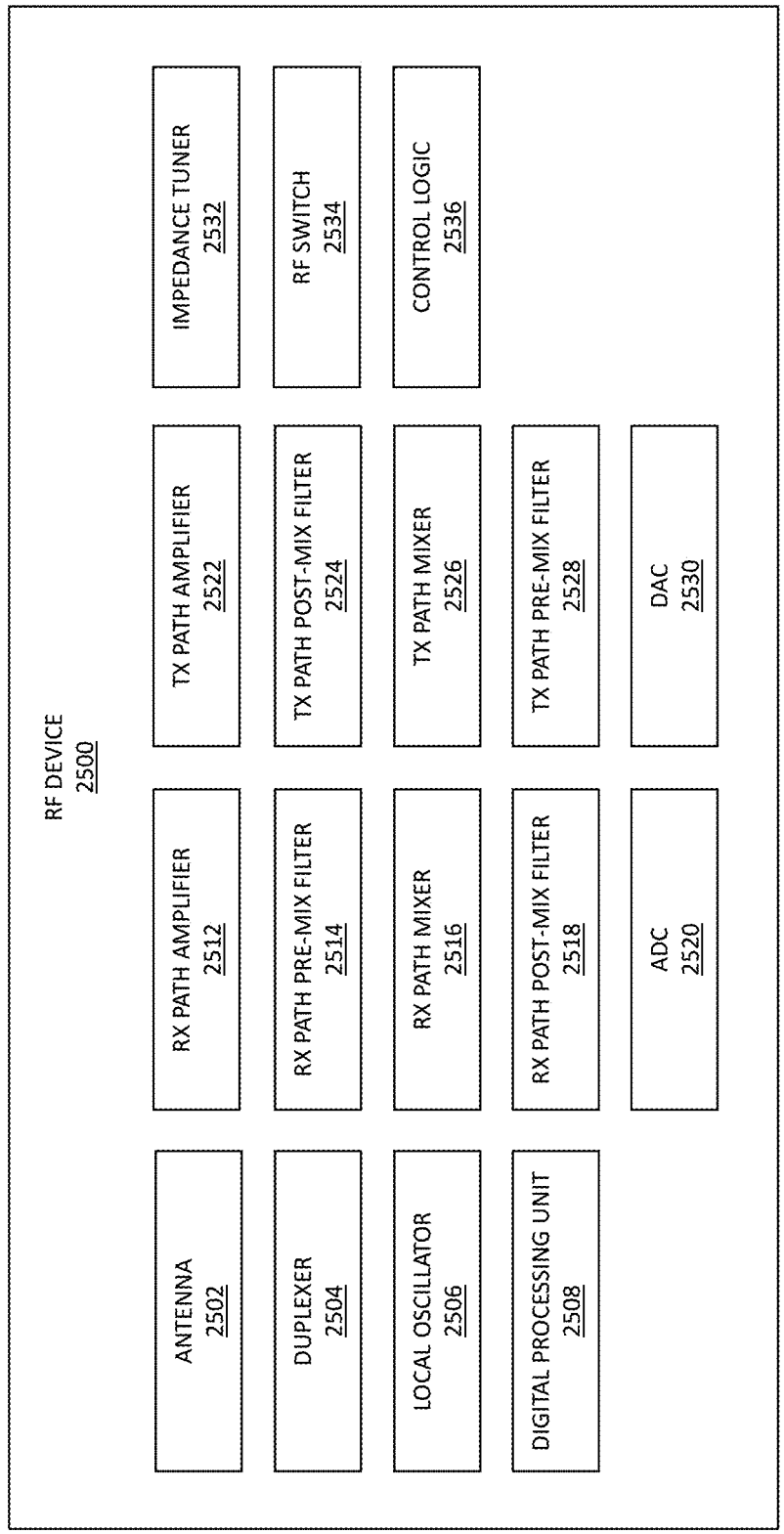
FIG. 9 is a block diagram of an example RF device that may include one or more IC structures having at least one transmission line structure integrated with one or more III-N devices in accordance with any of the embodiments of the present disclosure.

FIG. 9 is a block diagram of an example RF device 2500 that may include one or more components with one or more IC structures having at least one transmission line structure integrated with one or more III-N devices in accordance with any of the embodiments disclosed herein. For example, any suitable ones of the components of the RF device 2500 may include a die (e.g., the die 2002 as described with reference to FIG. 5 or a die implementing the IC structure as described with reference to FIG. 1 or 2) including one or more transmission line structures with a shield material and/or a dopant atom layer in accordance with any of the embodiments disclosed herein. Any of the components of the RF device 2500 may include an IC device (e.g., the IC structure of FIGS. 1-2) and/or an IC package 2200 as described with reference to FIG. 6. Any of the components of the RF device 2500 may include an IC device assembly 2300 as described with reference to FIG. 7. In some embodiments, the RF device 2500 may be included within any components of the computing device 2400 as described with reference to FIG. 8, or may be coupled to any of the components of the computing device 2400, e.g., be coupled to the memory 2404 and/or to the processing device 2402 of the computing device 2400. In still other embodiments, the RF device 2500 may further include any of the components described with reference to FIG. 8, such as, but not limited to, the battery/power circuit 2414, the memory 2404, and various input and output devices as shown in FIG. 8.

In general, the RF device 2500 may be any device or system that may support wireless transmission and/or reception of signals in the form of electromagnetic waves in the RF range of approximately 3 kiloHertz (kHz) to 300 gigaHertz (GHz). In some embodiments, the RF device 2500 may be used for wireless communications, e.g., in a BS or a UE device of any suitable cellular wireless communications technology, such as GSM, WCDMA, or LTE. In a further example, the RF device 2500 may be used as, or in, e.g., a BS or a UE device of a mm-wave wireless technology such as fifth generation (5G) wireless (i.e., high frequency/short wavelength spectrum, e.g., with frequencies in the range between about 20 and 60 GHz, corresponding to wavelengths in the range between about 5 and 15 millimeters). In yet another example, the RF device 2500 may be used for wireless communications using Wi-Fi technology (e.g., a frequency band of 2.4 GHz, corresponding to a wavelength of about 12 cm, or a frequency band of 5.8 GHz, spectrum, corresponding to a wavelength of about 5 cm), e.g., in a Wi-Fi-enabled device such as a desktop, a laptop, a video game console, a smart phone, a tablet, a smart TV, a digital audio player, a car, a printer, etc. In some implementations, a Wi-Fi-enabled device may, e.g., be a node in a smart system configured to communicate data with other nodes, e.g., a smart sensor. Still in another example, the RF device 2500 may be used for wireless communications using Bluetooth technology (e.g., a frequency band from about 2.4 to about 2.485 GHz, corresponding to a wavelength of about 12 cm). In other embodiments, the RF device 2500 may be used for transmitting and/or receiving RF signals for purposes other than communication, e.g., in an automotive radar system, or in medical applications such as magneto-resonance imaging (MRI).

In various embodiments, the RF device 2500 may be included in frequency-division duplex (FDD) or time-domain duplex (TDD) variants of frequency allocations that may be used in a cellular network. In an FDD system, the uplink (i.e., RF signals transmitted from the UE devices to a BS) and the downlink (i.e., RF signals transmitted from the BS to the US devices) may use separate frequency bands at the same time. In a TDD system, the uplink and the downlink may use the same frequencies but at different times.

A number of components are illustrated in FIG. 9 as included in the RF device 2500, but any one or more of these components may be omitted or duplicated, as suitable for the application. For example, in some embodiments, the RF device 2500 may be an RF device supporting both of wireless transmission and reception of RF signals (e.g., an RF transceiver), in which case it may include both the components of what is referred to herein as a transmit (TX) path and the components of what is referred to herein as a receive (RX) path. However, in other embodiments, the RF device 2500 may be an RF device supporting only wireless reception (e.g., an RF receiver), in which case it may include the components of the RX path, but not the components of the TX path; or the RF device 2500 may be an RF device supporting only wireless transmission (e.g., an RF transmitter), in which case it may include the components of the TX path, but not the components of the RX path.

In some embodiments, some or all of the components included in the RF device 2500 may be attached to one or more motherboards. In some embodiments, some or all of these components are fabricated on a single die, e.g., on a single SoC die.

Additionally, in various embodiments, the RF device 2500 may not include one or more of the components illustrated in FIG. 9, but the RF device 2500 may include interface circuitry for coupling to the one or more components. For example, the RF device 2500 may not include an antenna 2502, but may include antenna interface circuitry (e.g., a matching circuitry, a connector and driver circuitry) to which an antenna 2502 may be coupled. In another set of examples, the RF device 2500 may not include a digital processing unit 2508 or a local oscillator 2506, but may include device interface circuitry (e.g., connectors and supporting circuitry) to which a digital processing unit 2508 or a local oscillator 2506 may be coupled.

As shown in FIG. 9, the RF device 2500 may include an antenna 2502, a duplexer 2504, a local oscillator 2506, a digital processing unit 2508. As also shown in FIG. 9, the RF device 2500 may include an RX path that may include an RX path amplifier 2512, an RX path pre-mix filter 2514, a RX path mixer 2516, an RX path post-mix filter 2518, and an analog-to-digital converter (ADC) 2520. As further shown in FIG. 9, the RF device 2500 may include a TX path that may include a TX path amplifier 2522, a TX path post-mix filter 2524, a TX path mixer 2526, a TX path pre-mix filter 2528, and a digital-to-analog converter (DAC) 2530. Still further, the RF device 2500 may further include an impedance tuner 2532, an RF switch 2534, and control logic 2536. In various embodiments, the RF device 2500 may include multiple instances of any of the components shown in FIG. 9. In some embodiments, the RX path amplifier 2512, the TX path amplifier 2522, the duplexer 2504, and the RF switch 2534 may be considered to form, or be a part of, an RF FE of the RF device 2500. In some embodiments, the RX path amplifier 2512, the TX path amplifier 2522, the duplexer 2504, and the RF switch 2534 may be considered to form, or be a part of, an RF FE of the RF device 2500. In some embodiments, the RX path mixer 2516 and the TX path mixer 2526 (possibly with their associated pre-mix and post-mix filters shown in FIG. 9) may be considered to form, or be a part of, an RF transceiver of the RF device 2500 (or of an RF receiver or an RF transmitter if only RX path or TX path components, respectively, are included in the RF device 2500). In some embodiments, the RF device 2500 may further include one or more control logic elements/circuits, shown in FIG. 9 as control logic 2536, e.g., an RF FE control interface. The control logic 2536 may be used to, e.g., enhance control of complex RF system environment, support implementation of envelope tracking techniques, reduce dissipated power, etc. Various IC structures as described herein may be particularly advantageous for realizing at least portions of such control logic elements/circuits.

The antenna 2502 may be configured to wirelessly transmit and/or receive RF signals in accordance with any wireless standards or protocols, e.g., Wi-Fi, LTE, or GSM, as well as any other wireless protocols that are designated as 3G, 4G, 5G, and beyond. If the RF device 2500 is an FDD transceiver, the antenna 2502 may be configured for concurrent reception and transmission of communication signals in separate, i.e., non-overlapping and non-continuous, bands of frequencies, e.g. in bands having a separation of, e.g., 20 MHz from one another. If the RF device 2500 is a TDD transceiver, the antenna 2502 may be configured for sequential reception and transmission of communication signals in bands of frequencies that may be the same, or overlapping for TX and RX paths. In some embodiments, the RF device 2500 may be a multi-band RF device, in which case the antenna 2502 may be configured for concurrent reception of signals having multiple RF components in separate frequency bands and/or configured for concurrent transmission of signals having multiple RF components in separate frequency bands. In such embodiments, the antenna 2502 may be a single wide-band antenna or a plurality of band-specific antennas (i.e., a plurality of antennas each configured to receive and/or transmit signals in a specific band of frequencies). In various embodiments, the antenna 2502 may include a plurality of antenna elements, e.g., a plurality of antenna elements forming a phased antenna array (i.e., a communication system or an array of antennas that may use a plurality of antenna elements and phase shifting to transmit and receive RF signals). Compared to a single-antenna system, a phased antenna array may offer advantages such as increased gain, ability of directional steering, and simultaneous communication. In some embodiments, the RF device 2500 may include more than one antenna 2502 to implement antenna diversity. In some such embodiments, the RF switch 2534 may be deployed to switch between different antennas. Any of the embodiments of the IC structures with at least one transmission line structure integrated with one or more III-N devices, e.g., with at least one transmission line structure with a shield material and/or a dopant atom layer as described herein, may be used to implement at least a portion of the RF switch 2534.

An output of the antenna 2502 may be coupled to the input of the duplexer 2504. The duplexer 2504 may be any suitable component configured for filtering multiple signals to allow for bidirectional communication over a single path between the duplexer 2504 and the antenna 2502. The duplexer 2504 may be configured for providing RX signals to the RX path of the RF device 2500 and for receiving TX signals from the TX path of the RF device 2500.

The RF device 2500 may include one or more local oscillators 2506, configured to provide local oscillator signals that may be used for downconversion of the RF signals received by the antenna 2502 and/or upconversion of the signals to be transmitted by the antenna 2502.

The RF device 2500 may include the digital processing unit 2508, which may include one or more processing devices. In some embodiments, the digital processing unit 2508 may be implemented as the processing device 2402 shown in FIG. 8, descriptions of which are provided above (when used as the digital processing unit 2508, the processing device 2402 may, but does not have to, implement any of the IC structures as described herein, e.g., IC structures having one or more transmission line structures with a shield material and/or a dopant atom layer in accordance with any of the embodiments disclosed herein). The digital processing unit 2508 may be configured to perform various functions related to digital processing of the RX and/or TX signals. Examples of such functions include, but are not limited to, decimation/downsampling, error correction, digital downconversion or upconversion, DC offset cancellation, automatic gain control, etc. Although not shown in FIG. 9, in some embodiments, the RF device 2500 may further include a memory device, e.g., the memory device 2404 as described with reference to FIG. 8, configured to cooperate with the digital processing unit 2508. When used within, or coupled to, the RF device 2500, the memory device 2404 may, but does not have to, implement any of the IC structures as described herein, e.g., IC structures having one or more transmission line structures with a shield material and/or a dopant atom layer in accordance with any of the embodiments disclosed herein.

Turning to the details of the RX path that may be included in the RF device 2500, the RX path amplifier 2512 may include a low-noise amplifier (LNA). An input of the RX path amplifier 2512 may be coupled to an antenna port (not shown) of the antenna 2502, e.g., via the duplexer 2504. The RX path amplifier 2512 may amplify the RF signals received by the antenna 2502.

An output of the RX path amplifier 2512 may be coupled to an input of the RX path pre-mix filter 2514, which may be a harmonic or band-pass (e.g., low-pass) filter, configured to filter received RF signals that have been amplified by the RX path amplifier 2512.

An output of the RX path pre-mix filter 2514 may be coupled to an input of the RX path mixer 2516, also referred to as a downconverter. The RX path mixer 2516 may include two inputs and one output. A first input may be configured to receive the RX signals, which may be current signals, indicative of the signals received by the antenna 2502 (e.g., the first input may receive the output of the RX path pre-mix filter 2514). A second input may be configured to receive local oscillator signals from one of the local oscillators 2506. The RX path mixer 2516 may then mix the signals received at its two inputs to generate a downconverted RX signal, provided at an output of the RX path mixer 2516. As used herein, downconversion refers to a process of mixing a received RF signal with a local oscillator signal to generate a signal of a lower frequency. In particular, the TX path mixer (e.g., downconverter) 2516 may be configured to generate the sum and/or the difference frequency at the output port when two input frequencies are provided at the two input ports. In some embodiments, the RF device 2500 may implement a direct-conversion receiver (DCR), also known as homodyne, synchrodyne, or zero-IF receiver, in which case the RX path mixer 2516 may be configured to demodulate the incoming radio signals using local oscillator signals whose frequency is identical to, or very close to the carrier frequency of the radio signal. In other embodiments, the RF device 2500 may make use of downconversion to an intermediate frequency (IF). IFs may be used in superheterodyne radio receivers, in which a received RF signal is shifted to an IF, before the final detection of the information in the received signal is done. Conversion to an IF may be useful for several reasons. For example, when several stages of filters are used, they can all be set to a fixed frequency, which makes them easier to build and to tune. In some embodiments, the RX path mixer 2516 may include several such stages of IF conversion.

Although a single RX path mixer 2516 is shown in the RX path of FIG. 9, in some embodiments, the RX path mixer 2516 may be implemented as a quadrature downconverter, in which case it would include a first RX path mixer and a second RX path mixer. The first RX path mixer may be configured for performing downconversion to generate an in-phase (I) downconverted RX signal by mixing the RX signal received by the antenna 2502 and an in-phase component of the local oscillator signal provided by the local oscillator 2506. The second RX path mixer may be configured for performing downconversion to generate a quadrature (Q) downconverted RX signal by mixing the RX signal received by the antenna 2502 and a quadrature component of the local oscillator signal provided by the local oscillator 2506 (the quadrature component is a component that is offset, in phase, from the in-phase component of the local oscillator signal by 90 degrees). The output of the first RX path mixer may be provided to a I-signal path, and the output of the second RX path mixer may be provided to a Q-signal path, which may be substantially 90 degrees out of phase with the I-signal path.

The output of the RX path mixer 2516 may, optionally, be coupled to the RX path post-mix filter 2518, which may be low-pass filters. In case the RX path mixer 2516 is a quadrature mixer that implements the first and second mixers as described above, the in-phase and quadrature components provided at the outputs of the first and second mixers respectively may be coupled to respective individual first and second RX path post-mix filters included in the filter 2518.

The ADC 2520 may be configured to convert the mixed RX signals from the RX path mixer 2516 from analog to digital domain. The ADC 2520 may be a quadrature ADC that, similar to the RX path quadrature mixer 2516, may include two ADCs, configured to digitize the downconverted RX path signals separated in in-phase and quadrature components. The output of the ADC 2520 may be provided to the digital processing unit 2508, configured to perform various functions related to digital processing of the RX signals so that information encoded in the RX signals can be extracted.

Turning to the details of the TX path that may be included in the RF device 2500, the digital signal to later be transmitted (TX signal) by the antenna 2502 may be provided, from the digital processing unit 2508, to the DAC 2530. Similar to the ADC 2520, the DAC 2530 may include two DACs, configured to convert, respectively, digital I- and Q-path TX signal components to analog form.

Optionally, the output of the DAC 2530 may be coupled to the TX path pre-mix filter 2528, which may be a band-pass (e.g., low-pass) filter (or a pair of band-pass, e.g., low-pass, filters, in case of quadrature processing) configured to filter out, from the analog TX signals output by the DAC 2530, the signal components outside of the desired band. The digital TX signals may then be provided to the TX path mixer 2526, which may also be referred to as an upconverter. Similar to the RX path mixer 2516, the TX path mixer 2526 may include a pair of TX path mixers, for in-phase and quadrature component mixing. Similar to the first and second RX path mixers that may be included in the RX path, each of the TX path mixers of the TX path mixer 2526 may include two inputs and one output. A first input may receive the TX signal components, converted to the analog form by the respective DAC 2530, which are to be upconverted to generate RF signals to be transmitted. The first TX path mixer may generate an in-phase (I) upconverted signal by mixing the TX signal component converted to analog form by the DAC 2530 with the in-phase component of the TX path local oscillator signal provided from the local oscillator 2506 (in various embodiments, the local oscillator 2506 may include a plurality of different local oscillators, or be configured to provide different local oscillator frequencies for the mixer 2516 in the RX path and the mixer 2526 in the TX path). The second TX path mixer may generate a quadrature phase (Q) upconverted signal by mixing the TX signal component converted to analog form by the DAC 2530 with the quadrature component of the TX path local oscillator signal. The output of the second TX path mixer may be added to the output of the first TX path mixer to create a real RF signal. A second input of each of the TX path mixers may be coupled the local oscillator 2506.

Optionally, the RF device 2500 may include the TX path post-mix filter 2524, configured to filter the output of the TX path mixer 2526.

The TX path amplifier 2522 may be a PA, configured to amplify the upconverted RF signal before providing it to the antenna 2502 for transmission. Any of the embodiments of the IC structures with at least one transmission line structure integrated with one or more III-N devices may be used to implement the TX path amplifier 2522 as a PA.

In various embodiments, any of the RX path pre-mix filter 2514, the RX path post-mix filter 2518, the TX post-mix filter 2524, and the TX pre-mix filter 2528 may be implemented as RF filters. In some embodiments, each of such RF filters may include one or more, typically a plurality of, resonators (e.g., film bulk acoustic resonators (FBARs), Lamb wave resonators, and/or contour-wave resonators), arranged, e.g., in a ladder configuration. An individual resonator of an RF filter may include a layer of a piezoelectric material such as AlN, enclosed between a bottom electrode and a top electrode, with a cavity provided around a portion of each electrode in order to allow a portion of the piezoelectric material to vibrate during operation of the filter. In some embodiments, an RF filter may be implemented as a plurality of RF filters, or a filter bank. A filter bank may include a plurality of RF resonators that may be coupled to a switch, e. g., the RF switch 2534, configured to selectively switch any one of the plurality of RF resonators on and off (i.e., activate any one of the plurality of RF resonators), in order to achieve desired filtering characteristics of the filter bank (i.e., in order to program the filter bank). For example, such a filter bank may be used to switch between different RF frequency ranges when the RF device 2500 is, or is included in, a BS or in a UE device. In another example, such a filter bank may be programmable to suppress TX leakage on the different duplex distances.

The impedance tuner 2532 may include any suitable circuitry, configured to match the input and output impedances of the different RF circuitries to minimize signal losses in the RF device 2500. For example, the impedance tuner 2532 may include an antenna impedance tuner. Being able to tune the impedance of the antenna 2502 may be particularly advantageous because antenna's impedance is a function of the environment that the RF device 2500 is in, e.g. antenna's impedance changes depending on, e.g., if the antenna is held in a hand, placed on a car roof, etc.

As described above, the RF switch 2534 may be used to selectively switch between a plurality of instances of any one of the components shown in FIG. 9, in order to achieve desired behavior and characteristics of the RF device 2500. For example, in some embodiments, an RF switch may be used to switch between different antennas 2502. In other embodiments, an RF switch may be used to switch between a plurality of RF resonators (e.g., by selectively switching RF resonators on and off) of any of the filters included in the RF device 2500.

In various embodiments, one or more of the transmission line structures with a shield material and/or a dopant atom layer as described herein may be particularly advantageous when used in, or to provide an RF interconnect to (i.e., to provide means for supporting communication of RF signals to), any of the duplexer 2504, RX path amplifier 2512, RX path pre-mix filter 2514, RX path post-mix filter 2518, TX path amplifier 2522, TX path pre-mix filter 2528, TX path post-mix filter 2524, impedance tuner 2532, and/or RF switch 2534.

The RF device 2500 provides a simplified version and, in further embodiments, other components not specifically shown in FIG. 9 may be included. For example, the RX path of the RF device 2500 may include a current-to-voltage amplifier between the RX path mixer 2516 and the ADC 2520, which may be configured to amplify and convert the downconverted signals to voltage signals. In another example, the RX path of the RF device 2500 may include a balun transformer for generating balanced signals. In yet another example, the RF device 2500 may further include a clock generator, which may, e.g., include a suitable phased-lock loop (PLL), configured to receive a reference clock signal and use it to generate a different clock signal that may then be used for timing the operation of the ADC 2520, the DAC 2530, and/or that may also be used by the local oscillator 2506 to generate the local oscillator signals to be used in the RX path or the TX path.

Select Examples

The following paragraphs provide various examples of the embodiments disclosed herein.

Example 1 provides an IC structure that includes a support structure (e.g., a substrate, a die, or a chip) and a transmission line structure. The transmission line structure includes a III-N semiconductor material provided over the support structure, a polarization material provided over the III-N semiconductor material (where the III-N semiconductor material and the polarization material may form a channel stack for one or more III-N devices, e.g., one or more III-N transistors, provided elsewhere over the support structure), a transmission line of an electrically conductive material, an insulator material between the transmission line and the polarization material, and a third material (which may be referred to herein as a "shield material") between the polarization material and the transmission line, the shield material including at least one metal or a doped semiconductor material having a dopant concentration of at least $10^{16}$ #/cm$^3$, including all values and ranges therein, e.g., of at least $10^{18}$ #/cm$^3$, or of at least $10^{20}$ #/cm$^3$.

Example 2 provides the IC structure according to example 1, where the shield material is in contact with the polarization material.

Example 3 provides the IC structure according to examples 1 or 2, where the insulator material is in contact with the shield material.

Example 4 provides the IC structure according to any one of the preceding examples, where the shield material includes the doped semiconductor material, the doped semiconductor material includes gallium and nitrogen (e.g., GaN or InGaN), and the dopant atoms are N-type dopant atoms.

Example 5 provides the IC structure according to example 4, where the doped semiconductor material further includes indium.

Example 6 provides the IC structure according to any one of the preceding examples, where the shield material has a thickness (i.e., a dimension measured in a direction perpendicular to the support structure) of at least about 50 nanometers.

Example 7 provides the IC structure according to example 6, where the thickness of the shield material is between about 50 nanometers and 2 micrometers, including all values and ranges therein, e.g., between about 100 nanometers and 1 micrometer.

Example 8 provides an IC structure that includes a support structure (e.g., a substrate, a die, or a chip) and a transmission line structure. The transmission line structure includes a III-N semiconductor material provided over the support structure, a polarization material provided over the III-N semiconductor material (where the III-N semiconductor material and the polarization material may form a channel stack for one or more III-N devices, e.g., one or more III-N transistors, provided elsewhere over the support structure), a transmission line of an electrically conductive material, and an insulator material between the transmission line and the polarization material. The polarization material and at least a portion of the III-N semiconductor material that is closest to the polarization material is doped with dopant atoms having a dopant concentration of at least $10^{15}$ dopant atoms (#) per cubic centimeter ($cm^{-3}$), including all values and ranges therein, e.g., of at least $10^{18}$ #/$cm^3$, or of at least $10^{20}$#/$cm^3$.

Example 9 provides the IC structure according to example 8, where the dopant atoms include one or more of hydrogen, argon, or fluorine.

Example 10 provides the IC structure according to examples 8 or 9, where a thickness (i.e., a dimension measured in a direction perpendicular to the support structure) of the portion of the III-N semiconductor material that is doped with the dopant atoms is at least about 2 nanometers, including all values and ranges therein, e.g., at least about 3 nanometers, or between about 2-3 nanometers and 500 nanometers.

Example 11 provides the IC structure according to any one of the preceding examples, where a thickness (i.e., a dimension measured in a direction perpendicular to the support structure) of the insulator material between the transmission line and the polarization material is between about 2 micrometers and 20 micrometers, including all values and ranges therein, e.g., between about 2 micrometers and 10 micrometers, or between about 4 micrometers and 7 micrometers.

Example 12 provides the IC structure according to any one of the preceding examples, where a thickness (i.e., a dimension measured in a direction perpendicular to the support structure) of the electrically conductive material of the transmission line is between about 2 micrometers and 10 micrometers, including all values and ranges therein, e.g., between about 2 micrometers and 5 micrometers, or between about 2.5 micrometers and 3.5 micrometers.

Example 13 provides the IC structure according to any one of the preceding examples, where a length (i.e., a dimension measured in directions of propagation of an RF signal in the transmission line) of the transmission line is at least about 200 micrometers, including all values and ranges therein, e.g., at least about 300 micrometers, or at least about 450 micrometers.

Example 14 provides the IC structure according to any one of the preceding examples, where a width (i.e., a dimension measured perpendicular to the length of the transmission line and in a plane parallel to the support structure) of the transmission line is between about 10 micrometers and 100 micrometers, including all values and ranges therein, e.g., between about 20 micrometers and 75 micrometers, or between about 25 micrometers and 45 micrometers.

Example 15 provides the IC structure according to any one of the preceding examples, further including a cover material provided over the electrically conductive material of the transmission line. Such a cover material may act as a sealant, helping to reduce or avoid degradation (e.g., by oxidation) of the electrically conductive material of the transmission line.

Example 16 provides the IC structure according to example 15, where the cover material includes silicon and nitrogen (e.g., SiN).

Example 17 provides the IC structure according to any one of the preceding examples, where the polarization material is a substantially crystalline semiconductor material that has a lattice constant smaller than a lattice constant of the III-N semiconductor material. Thus, a tensile strain is induced in the polarization material due to the lattice mismatch between the polarization material and the III-N semiconductor material on which the polarization material is grown.

Example 18 provides the IC structure according to any one of the preceding examples, where the polarization material includes aluminum, indium, gallium, and nitrogen (e.g., $Al_xIn_yGa_zN$).

Example 19 provides the IC structure according to any one of the preceding examples, where a thickness of the polarization material is between about 1 and 100 nanometers, including all values and ranges therein, e.g., between about 5 and 15 nanometers or between about 10 and 30 nanometers.

Example 20 provides the IC structure according to any one of the preceding examples, further including a buffer material below the III-N semiconductor material.

Example 21 provides the IC structure according to example 20, where the buffer material is a semiconductor material that has a band gap larger than that of the III-N semiconductor material.

Example 22 provides the IC structure according to examples 20 or 21, where a thickness of the buffer material is between about 100 and 5000 nanometers, including all values and ranges therein, e.g., between about 200 and 1000 nanometers, or between about 250 and 500 nanometers.

Example 23 provides the IC structure according to any one of the preceding examples, further including a III-N transistor, coupled to the transmission line structure.

Example 24 provides the IC structure according to example 23, where the III-N transistor is a part of a RF circuit.

Example 25 provides the IC structure according to any one of the preceding examples, where the transmission line structure is a part of a RF switch of an RF communications device, e.g. of an RF transceiver. In other examples, the transmission line structure may be a transmission line structure configured to provide RF signals to/from any other components of an RF communications device, such components including, e.g., a duplexer, a power amplifier, a low-noise amplifier, various filters, etc.

Example 26 provides the IC structure according to any one of the preceding examples, where the IC structure is included in, or used to implement at least a portion of, an RF FE.

Example 27 provides an IC package that includes an IC die, the IC die including the IC structure according to any one of the preceding examples (e.g., any one of examples 1-26), and a further IC component, coupled to the IC die.

Example 28 provides an IC package that includes an IC die and a further IC component, coupled to the IC die. The IC die includes a transmission line structure having a III-N semiconductor material, a polarization material provided over the III-N semiconductor material, a transmission line of an electrically conductive material, an insulator material between the transmission line and the polarization material, and means for reducing electromagnetic coupling between the transmission line and charge carriers formed below an interface between the polarization material and the III-N semiconductor material.

Example 29 provides the IC package according to example 28, where said means include a shield material between the polarization material and the transmission line, the shield material including a doped semiconductor material having a dopant concentration of at least $10^{16}$ dopant atoms (#) per cubic centimeter ($cm^{-3}$), including all values and ranges therein, e.g., of at least $10^{18}$ #/$cm^3$, or of at least $10^{20}$ #/$cm^3$.

Example 30 provides the IC package according to example 28, where said means include a shield material between the polarization material and the transmission line, the shield material including at least one metal.

Example 31 provides the IC package according to examples 29 or 30, where the shield material has a thickness (i.e., a dimension measured in a direction perpendicular to the support structure) of at least about 50 nanometers.

Example 32 provides the IC package according to example 28, where said means include dopant atoms in the polarization material and at least a portion of the III-N semiconductor material that is closest to the polarization material, where a dopant concentration of the dopant atoms is at least $10^{15}$ dopant atoms (#) per cubic centimeter ($cm^{-3}$), including all values and ranges therein, e.g., of at least $10^{18}$ #/$cm^3$, or of at least $10^{20}$ #/$cm^3$.

Example 33 provides the IC package according to any one of examples 27-32, where the further IC component includes one of a package substrate, an interposer, or a further IC die.

Example 34 provides the IC package according to any one of examples 27-33, where the IC package is included in a base station of a wireless communication system.

Example 35 provides the IC package according to any one of examples 27-33, where the IC package is included in a UE device (e.g., a mobile device) of a wireless communication system.

Example 36 provides the IC package according to any one of the preceding examples, where the IC die is a part of an RF device.

Example 37 provides an electronic device that includes a carrier substrate and an IC die coupled to the carrier substrate. The IC die includes the IC structure according to any one of examples 1-26, and/or is included in the IC package according to any one of examples 27-36.

Example 38 provides the electronic device according to example 37, where the computing device is a wearable or handheld electronic device.

Example 39 provides the electronic device according to examples 37 or 38, where the electronic device further includes one or more communication chips and an antenna.

Example 40 provides the electronic device according to any one of examples 37-39, where the carrier substrate is a motherboard.

Example 41 provides the electronic device according to any one of examples 37-40, where the electronic device is an RF transceiver.

Example 42 provides the electronic device according to any one of examples 37-41, where the electronic device is one of an RF switch, a power amplifier, a low-noise amplifier, a filter, a filter bank, a duplexer, an upconverter, or a downconverter of an RF communications device, e.g. of an RF transceiver.

Example 43 provides the electronic device according to any one of examples 37-42, where the electronic device is included in a base station of a wireless communication system.

Example 44 provides the electronic device according to any one of examples 37-42, where the electronic device is included in a UE device (e.g., a mobile device) of a wireless communication system.

Example 45 provides a method of manufacturing an IC structure. The method includes providing a III-N semiconductor material over a support structure (e.g., a substrate, a die, or a chip) and providing a polarization material over the III-N semiconductor material. The method also includes providing means for reducing electromagnetic coupling between a transmission line and charge carriers that are below an interface between the polarization material and the III-N semiconductor material, e.g., providing a shield material over a portion of the polarization material or implanting dopant atoms in the portion of the polarization material and at least a portion of the III-N semiconductor material that is closest to the portion of the polarization material with the dopant atoms. The method further includes providing an insulator material over the means for reducing electromagnetic coupling, e.g., over the shield material or the dopant atoms, and further providing the transmission line of an electrically conductive material over the insulator material.

Example 46 provides the method according to example 45, further including forming a III-N transistor so that a further portion of the III-N semiconductor material forms a channel region of the further III-N transistor.

Example 47 provides the method according to examples 45 or 46, where the IC structure is the IC structure according to any one of examples 1-26, and the method includes corresponding further processes to manufacture any of these IC structures.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize. These modifications may be made to the disclosure in light of the above detailed description.

The invention claimed is:

1. An integrated circuit (IC) structure, comprising:
a transmission line structure that includes:

a first material, the first material including a III-N semiconductor material, a second material over the first material, the second material having a lattice constant smaller than a lattice constant of the III-N semiconductor material, a transmission line, wherein the transmission line includes an electrically conductive material, an insulator material between the transmission line and the second material, and a third material between the second material and the transmission line, the third material including a metal or a semiconductor material, wherein the semiconductor material has a dopant concentration of at least $10^{16}$ dopant atoms per cubic centimeter.

2. The IC structure according to claim 1, wherein the third material is in contact with the second material.

3. The IC structure according to claim 1, wherein the insulator material is in contact with the third material.

4. The IC structure according to claim 1, wherein:

the third material includes a semiconductor material, wherein the semiconductor material has a dopant concentration of at least $10^{16}$ dopant atoms per cubic centimeter, the semiconductor material includes gallium and nitrogen, and the dopant atoms are N-type dopant atoms.

5. The IC structure according to claim 4, wherein the semiconductor material further includes indium.

6. The IC structure according to claim 1, wherein the third material has a thickness of at least 50 nanometers.

7. The IC structure according to claim 6, wherein the third material has the thickness between 50 nanometers and 2 micrometers.

8. An integrated circuit (IC) structure, comprising:

a transmission line structure that includes:

a III-N semiconductor material, a polarization material over the III-N semiconductor material, a transmission line of an electrically conductive material, and an insulator material between the transmission line and the polarization material, wherein the polarization material and at least a portion of the III-N semiconductor material that is closest to the polarization material includes dopant atoms having a dopant concentration of at least $10^{15}$ dopant atoms per cubic centimeter.

9. The IC structure according to claim 8, wherein the dopant atoms include one or more of hydrogen, argon, or fluorine.

10. The IC structure according to claim 8, wherein a thickness of the portion of the III-N semiconductor material that includes the dopant atoms is at least 2 nanometers.

11. The IC structure according to claim 8, wherein a thickness of the insulator material between the transmission line and the polarization material is between 2 and 20 micrometers.

12. The IC structure according to claim 8, wherein a thickness of the transmission line is between 2 and 10 micrometers.

13. The IC structure according to claim 8, wherein a length of the transmission line is at least 200 micrometers.

14. The IC structure according to claim 8, wherein a width of the transmission line is between 10 and 100 micrometers.

15. The IC structure according to claim 8, further including a material over the electrically conductive material of the transmission line, wherein the material includes silicon and nitrogen.

16. The IC structure according to claim 8, wherein the polarization material has a lattice constant smaller than a lattice constant of the III-N semiconductor material.

17. The IC structure according to claim 8, further including a III-N transistor.

18. The IC structure according to claim 8, wherein the transmission line structure is a part of a radio frequency (RF) switch of an RF communications device.

19. A method of manufacturing an integrated circuit (IC) structure, the method comprising:

providing a III-N semiconductor material over a support structure;

providing a polarization material over the III-N semiconductor material;

providing means for reducing electromagnetic coupling between a transmission line and charge carriers that are below an interface between the polarization material and the III-N semiconductor material;

providing an insulator material over the means for reducing electromagnetic coupling; and providing the transmission line of an electrically conductive material over the insulator material.

20. The method according to claim 19, further comprising:

forming a III-N transistor so that a portion of the III-N semiconductor material is a channel region of the III-N transistor.

* * * * *